(12) United States Patent
Then et al.

(10) Patent No.: US 9,666,708 B2
(45) Date of Patent: May 30, 2017

(54) III-N TRANSISTORS WITH ENHANCED BREAKDOWN VOLTAGE

(71) Applicant: INTEL CORPORATION, Santa Clara, CA (US)

(72) Inventors: Han Wui Then, Portland, OR (US); Benjamin Chu-Kung, Portland, OR (US); Sansaptak Dasgupta, Hillsboro, OR (US); Robert S. Chau, Beaverton, OR (US); Seung Hoon Sung, Beaverton, OR (US); Ravi Pillarisetty, Portland, OR (US); Marko Radosavljevic, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/120,705

(22) PCT Filed: Mar. 26, 2014

(86) PCT No.: PCT/US2014/031903
§ 371 (c)(1),
(2) Date: Aug. 22, 2016

(87) PCT Pub. No.: WO2015/147816
PCT Pub. Date: Oct. 1, 2015

(65) Prior Publication Data
US 2017/0018640 A1    Jan. 19, 2017

(51) Int. Cl.
*H01L 29/778*   (2006.01)
*H01L 29/66*    (2006.01)
(Continued)

(52) U.S. Cl.
CPC ...... *H01L 29/7787* (2013.01); *H01L 21/0254* (2013.01); *H01L 21/02636* (2013.01);
(Continued)

(58) Field of Classification Search
None
See application file for complete search history.

(56) References Cited

U.S. PATENT DOCUMENTS

| 7,952,150 B1 | 5/2011 | Wohlmuth |
| 9,153,583 B2 * | 10/2015 | Glass ................ H01L 29/0847 |
| 2013/0015460 A1 * | 1/2013 | Chen ................ H01L 21/28575 257/76 |

(Continued)

FOREIGN PATENT DOCUMENTS

| JP | 2007317794 | 12/2007 |
| JP | 2013128135 | 6/2013 |

OTHER PUBLICATIONS

International Preliminary Report on Patentability for PCT/US2014/031903 mailed Oct. 6, 2016, 6 pages.
(Continued)

*Primary Examiner* — Minh-Loan Tran
(74) *Attorney, Agent, or Firm* — Green, Howard & Mughal LLP

(57) ABSTRACT

Techniques related to III-N transistors having enhanced breakdown voltage, systems incorporating such transistors, and methods for forming them are discussed. Such transistors include a hardmask having an opening over a substrate, a source, a drain, and a channel between the source and drain, and a portion of the source or the drain disposed over the opening of the hardmask.

24 Claims, 12 Drawing Sheets

(51) Int. Cl.
| | |
|---|---|
| *H01L 29/20* | (2006.01) |
| *H01L 21/8252* | (2006.01) |
| *H01L 27/06* | (2006.01) |
| *H01L 21/02* | (2006.01) |
| *H01L 21/033* | (2006.01) |
| *H01L 29/08* | (2006.01) |
| *H01L 29/205* | (2006.01) |

(52) U.S. Cl.
CPC ...... *H01L 21/0332* (2013.01); *H01L 21/8252* (2013.01); *H01L 27/0605* (2013.01); *H01L 29/0847* (2013.01); *H01L 29/2003* (2013.01); *H01L 29/205* (2013.01); *H01L 29/66431* (2013.01); *H01L 29/66446* (2013.01); *H01L 29/66462* (2013.01); *H01L 29/7783* (2013.01); *H01L 29/7786* (2013.01)

(56) References Cited

U.S. PATENT DOCUMENTS

| | | |
|---|---|---|
| 2013/0049013 A1 | 2/2013 | Shimada |
| 2014/0042446 A1 | 2/2014 | Chiang |
| 2016/0111496 A1* | 4/2016 | Leobandung ....... H01L 29/1033 257/192 |

OTHER PUBLICATIONS

Notice of Allowance for Taiwan Patent Application No. 104104764 mailed Jul. 19, 2016, 2 pages (Translation Unavailable).

Office Action and Search Report for Taiwan Patent Application No. 104104764 mailed Feb. 24, 2016, 6 pages.

International Search Report and Written Opinion for International Patent Application No. PCT/US2014/031903, mailed on Dec. 22, 2014.

* cited by examiner

III-N TRANSISTORS WITH ENHANCED BREAKDOWN VOLTAGE

CLAIM OF PRIORITY

This application is a National Phase Application of, and claims priority to, PCT Application No. PCT/US14/31903, filed on 26 Mar. 2014, titled "III-N TRANSISTORS WITH ENHANCED BREAKDOWN VOLTAGE", which is incorporated by reference in its entirety.

TECHNICAL FIELD

Embodiments of the invention generally relate to III-N semiconductor transistors, and more particularly relate to III-N transistors with enhanced breakdown voltage, devices, and manufacturing techniques.

BACKGROUND

In some implementations, III-N material based transistors, such as gallium nitride (GaN) based transistors may be used for high voltage and/or high frequency applications. For example, power management integrated circuits (PMIC) and radio frequency integrated circuits (RFIC) may be critical functional blocks in system on a chip (SoC) implementations. Such SoC implementations may be found in mobile computing platforms such as smartphones, tablets, laptops, netbooks, and the like. In such implementations, the PMIC and RFIC are important factors for power efficiency and form factor (and can be as or more important than logic and memory circuits).

Gallium nitride based devices may be advantageous in some examples because GaN has a wide band gap (~3.4 eV) as compared to silicon (Si: ~1.1 eV). The wide band gap may allow a GaN transistor to withstand a larger electric field (e.g., applied voltage, $V_{DD}$) before suffering breakdown as compared to Si transistors of similar dimensions. Furthermore, GaN transistors may employ a 2D electron gas (e.g., 2D sheet charge) as its transport channel. For example, the 2D sheet charge may be formed at an abrupt hetero-interface formed by epitaxial deposition of a charge-inducing film with larger spontaneous and piezoelectric polarization such as aluminum nitride (AlN), aluminum gallium nitride (AlGaN) or aluminum indium nitride (AlInN) on GaN. Very high charge densities of up to $2 \times 10^{13}$ per $cm^2$ may be formed by such a mechanism without impurity dopants, allowing high mobilities of, for example, greater than 1000 $cm^2/(Vs)$.

For power management and radio frequency (RF) amplification, transistors may require large widths (e.g., greater than 1 mm) to deliver large currents (e.g., greater than 1 A) and large power (e.g., >1 W). Furthermore, to take full advantage of the discussed properties of GaN, the GaN transistors are typically heterogeneously integrated onto a Si substrate such that the GaN transistors may be placed in close proximity to Si CMOS devices. Such placement may minimize interconnect losses, provide for a smaller overall footprint, and provide scaling advantages.

As transistor pitch is reduced, the maximum breakdown voltage that a transistor may withstand may reduce proportionately with the shrinking of the gate-to-drain separation. Using current techniques, to withstand a larger breakdown voltage, the transistor gate-to-drain distance must be extended and the associated area penalty must be accepted. Using such techniques may require a trade-off between breakdown voltage and transistor scaling.

As such, existing techniques do not provide for scaling transistors to smaller pitches or increasing breakdown voltage at current pitches. Such problems may become critical in PMIC or RFIC implementations, for large voltage handling (e.g., direct battery connect, input/output, universal serial bus), or the like.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1A:
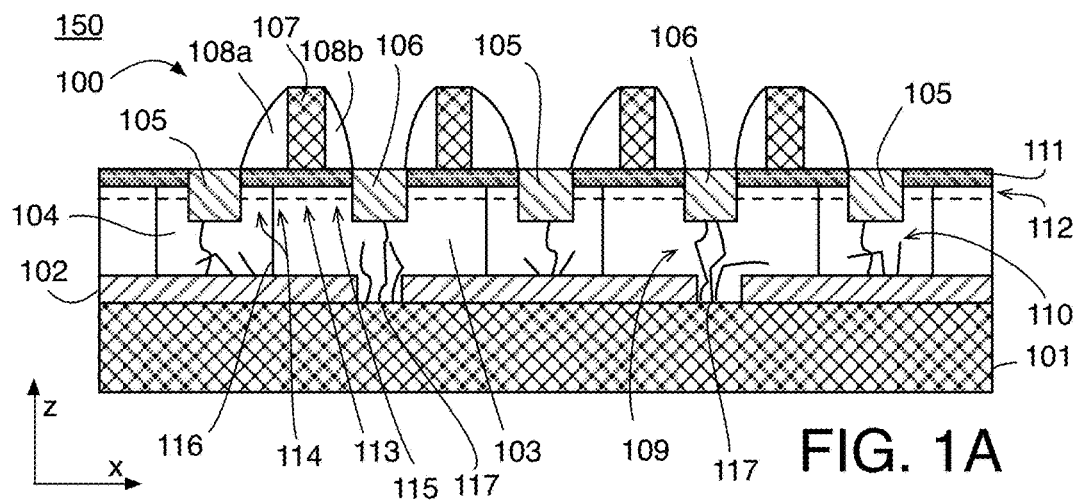
FIG. 1A is a side view of an example transistor structure including an example transistor.

One or more embodiments or implementations are now described with reference to the enclosed figures. While specific configurations and arrangements are discussed, it should be understood that this is done for illustrative purposes only. Persons skilled in the relevant art will recognize that other configurations and arrangements may be employed without departing from the spirit and scope of the description. It will be apparent to those skilled in the relevant art that techniques and/or arrangements described herein may also be employed in a variety of other systems and applications other than what is described herein.

Reference is made in the following detailed description to the accompanying drawings, which form a part hereof, wherein like numerals may designate like parts throughout to indicate corresponding or analogous elements. It will be appreciated that for simplicity and/or clarity of illustration, elements illustrated in the figures have not necessarily been drawn to scale. For example, the dimensions of some of the elements may be exaggerated relative to other elements for clarity. Further, it is to be understood that other embodiments may be utilized and structural and/or logical changes may be made without departing from the scope of claimed subject matter. It should also be noted that directions and references, for example, up, down, top, bottom, over, under, and so on, may be used to facilitate the discussion of the drawings and embodiments and are not intended to restrict the application of claimed subject matter. Therefore, the following detailed description is not to be taken in a limiting sense and the scope of claimed subject matter defined by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" my be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," "on", and/or the like, as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features.

As used in throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Transistors, devices, apparatuses, computing platforms, and methods are described below related to transistors having increased breakdown voltage for a given dimension.

As described above, it may be advantageous to reduce transistor pitch at a given transistor breakdown voltage or to provide an increased breakdown voltage at a given pitch (and/or associated given gate-to-drain separation distance or length. In one embodiment, a gallium nitride (GaN) transistor may include a hetero junction to a wider band gap material (e.g., as compared to the channel) in its extrinsic drain portion. For example, the wider band gap material may include aluminum gallium nitride ($Al_xGa_{1-x}N$). As described herein, the transistor may include an extrinsic drain portion proximal to the channel and an intrinsic drain portion distal to the channel and including a patterned and epitaxially re-grown region including, for example, a silicon dopant or the like. The wider band gap material in the extrinsic drain portion may provide a band gap wider or larger than that of the channel. For example, if the channel is GaN and the extrinsic drain portion includes $Al_xGa_{1-x}N$ having a percentage of aluminum (e.g., x) of about 10% and a balance of gallium, the band gap in the extrinsic drain portion (or a part of the extrinsic drain portion) may be increased by to 250 mV over the band gap of GaN (~3.4 eV).

In another embodiment, a GaN transistor may include a drain having a vertically oriented extrinsic drain portion and a horizontally or laterally oriented intrinsic drain portion. As used herein, the term laterally is meant to indicate components are arranged in a horizontal or substantially horizontal orientation. In an embodiment, the extrinsic drain portion may extend between a channel of the transistor and the intrinsic drain portion, which may be disposed under a hardmask. In some examples, the extrinsic drain portion may be n-doped to improve conductivity. For example, a light n-doping with an electron concentration of less than $10^3/cm^3$ may be used. In such examples, the transistor pitch may not include the intrinsic drain portion. Furthermore, the transistor drain may service two sources and a single gate may be coupled to two associated channels, as is discussed further herein below. In such embodiments, the breakdown voltage of the transistor may be increased based on the depth (e.g., length in a z-direction) of the extrinsic drain. Furthermore, in such embodiments, a hetero junction to a wider band gap material (e.g., as compared to the channel) may also be implemented in the extrinsic drain portion, as is discussed further herein.

In some embodiments, the transistor may include a hardmask having an opening over a substrate. The transistor may include a source, a drain, and a gate-coupled channel between the source and the drain. The channel may include gallium nitride and may be disposed over the hardmask. As discussed, the drain may include an extrinsic drain portion proximal to the channel and an intrinsic drain portion distal to the channel and, in such an embodiment, no doping may be required. A polarization layer may be disposed over the extrinsic drain portion and the channel. For example, the polarization layer may provide the 2D electron gas (e.g., 2D sheet charge) transport layer for the channel. A portion of the source or the drain may be disposed over the opening in the hardmask. For example, in embodiments including a hetero junction to a wider band gap material in the extrinsic drain and substantially laterally aligned intrinsic drain and source, a portion of the source may be disposed over the opening. In embodiments having a vertically oriented extrinsic drain portion and a laterally oriented intrinsic drain portion that is disposed under the hardmask, a portion of the drain may be disposed over the opening. These embodiments are discussed further herein with respect to FIGS. 1A-1C and 2A-2B.

Figure 1B:
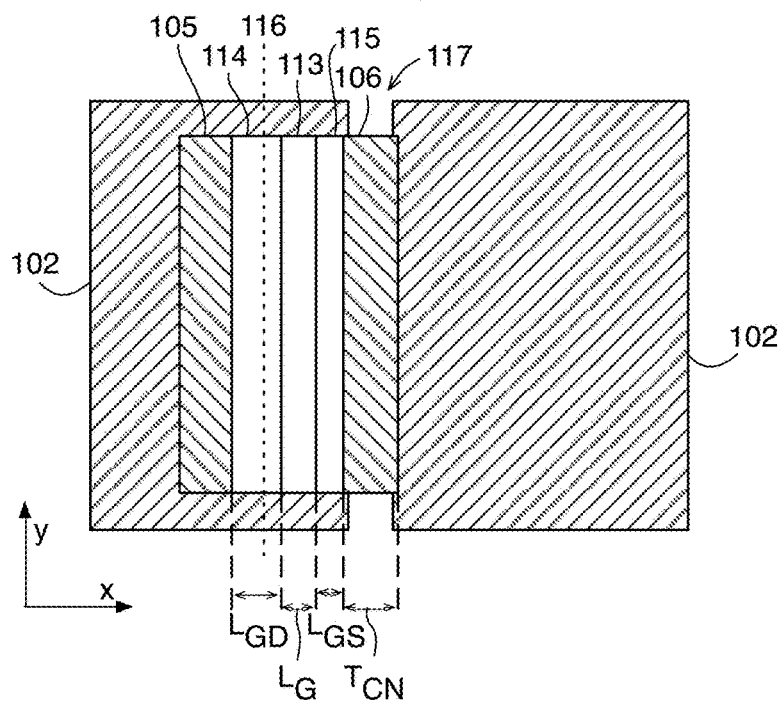
FIG. 1B is a plan view of portions of the example transistor of FIG. 1A.

FIG. 1A is a cross-sectional (side) view of an example transistor structure 150 including an example transistor 100 and FIG. 1B is a plan view of portions of example transistor 100, arranged in accordance with at least some implementations of the present disclosure. In some cases, only features associated with exemplary transistor 100 are labeled for the sake of clarity of presentation. As shown in FIG. 1A, transistor structure 150 may include a substrate 101, a hardmask 102 including openings 117, epitaxial III-N material regions 103, and wide band gap material regions 104. For example, wide band gap regions 104 may have a wider band gap as compared to epitaxial III-N material regions. In an embodiment, wide band gap regions 104 may be an epitaxial III-N material different than that of epitaxial III-N material regions 103, but having a substantial lattice match with respect to epitaxial III-N material regions 103. Epitaxial III-N material regions 103 may include defects (e.g., glide defects) 109 and wide band gap material regions 104 may include defects (e.g., stacking faults) 110. For example, a stacking fault may exist where two crystals merge from opposite directions of growth.

Also as shown, transistor structure 150 may include intrinsic source portions 105 and intrinsic drain portions 106. In some embodiments, adjacent transistors may share an intrinsic source as shown. Further, as used herein, the term "source" is meant to indicate a structure including an intrinsic source (or intrinsic source portion) and/or an extrinsic source (or extrinsic source portion). Similarly, the term "drain" is meant to indicate a structure including an intrinsic drain (or intrinsic drain portion) and/or an extrinsic drain (or extrinsic drain portion). As such, transistor 100 may include a source including exemplary intrinsic source portion 106 and an extrinsic source portion 113 (in FIG. 1A, only one extrinsic source portion is labeled for the sake of clarity). Similarly, transistor 100 may include a drain including exemplary intrinsic drain portion 105 and an extrinsic drain portion 114 (similarly, only one extrinsic drain portion is labeled for the sake of clarity). As used herein, the term extrinsic with respect to a source or drain is meant to indicate a portion of the source or drain having a material (e.g., a III-N material) that is either the same as or epitaxially associated with a channel or associated III-N material region. The term intrinsic is meant to include the source or drain portion that is in contact with an electrical contact, lead, or terminal, or the like. In some embodiments, the intrinsic source and drain may also be an epitaxially grown via an associated III-N material regions that includes a dopant (e.g., Si) that is not present in the adjacent and associated III-N material regions.

As shown, transistor 100 may include a channel 113 comprising the III-N material of epitaxial III-N material regions 103 (e.g., GaN) between extrinsic source portion 115 and extrinsic drain portion 114. Channel 113 may be gate coupled via gate 107. Furthermore, transistor 100 may include sidewall spacers 108a, 108b. Also as shown in FIG. 1A, transistor structure 150 may include a polarization layer 111 over channel 113, extrinsic source portion 115, and extrinsic drain portion 114. Polarization layer 111 may include any material, materials, or material stack that may provide a 2D electron gas 112 in epitaxial III-N material regions 103 and/or wide band gap material regions 104. For example, polarization layer 111 may be aluminum nitride (AlN), aluminum indium nitride (AlInN), or aluminum gallium nitride (AlGaN), or any combination thereof. For example, polarization layer 111, due to the polarization difference between epitaxial III-N material regions 103 and/or wide band gap material regions 104 and polarization layer 111, may provide for the formation of a high charge density and high mobility 2D electron gas 112 in epitaxial III-N material regions 103 and/or wide band gap material regions 104.

As shown in FIG. 1A, transistor 100 may include hardmask 102 disposed over substrate 101, and hardmask 102 may include openings 117. Transistor 100 may also include a source (optionally including extrinsic source portion 115 and intrinsic source portion 106), a drain (including extrinsic drain portion 114 and intrinsic drain portion 105), and a gate (e.g., gate 107) coupled channel 113 between the source and the drain. As discussed, channel 113 may comprise gallium nitride. Channel 113 may be disposed over hardmask 102 and extrinsic drain portion 114 may be proximal to channel 113 and intrinsic drain portion 105 may be distal to channel 113. Transistor 100 may also include polarization layer 111 disposed over at least extrinsic drain portion 114 and channel 113. Polarization layer 111 may be disposed under sidewall spacers 108a, 108b. As shown in FIG. 1A, at least a portion of the source (e.g., intrinsic source portion 106) may be disposed over opening 117 of hardmask 102.

Continuing with FIG. 1A, extrinsic drain portion 114 may include wide band gap material 104 (e.g., an epitaxial material having a wider band gap as compared to channel 113 and/or epitaxial III-N material 103). In an embodiment, wide band gap material 104 includes aluminum gallium nitride. For example, extrinsic drain portion 114 (e.g., as formed in wide band gap material 104) may include a material having a wider band gap than channel 113. As discussed, channel 113 may be disposed under gate 107 and may include epitaxial III-N material 103. In an example, epitaxial III-N material 103 comprises GaN. As shown in FIG. 1A, extrinsic drain portion 114 may also include epitaxial III-N material 103. At a hetero junction 116, extrinsic drain portion 114 may transition from epitaxial III-N material 103 to wide band gap material 104. For example, extrinsic drain portion 114 may be disposed under sidewall spacer 108a and may extend from channel 113 to intrinsic drain portion 114. In an embodiment, extrinsic drain portion 114 may include only wide band gap material 104 (e.g., hetero junction 116 may be aligned with the interface between gate 107 and sidewall spacer 108a). As shown, in some examples, sidewall spacers 108a and 108b may have different widths. For example, sidewall spacer 108a may be wider based on the implementation of extrinsic drain portion 114.

As discussed, extrinsic drain portion 114 including wide band gap material 104 may increase or enhance the breakdown voltage of transistor 100. For example, GaN may have a band gap of 3.4 eV while $Al_{0.1}Ga_{0.9}N$ may have a band gap of 3.64. For transistor 100, the breakdown voltage may be proportional to the band gap of the material in the extrinsic drain to the power of 2.5 (e.g., $E_c \sim E_g^{2.5}$, where $E_c$ is the critical breakdown field in MV/cm and $E_g$ is the band gap of the material in the extrinsic drain in eV). For a transistor implementing only GaN in extrinsic drain portion 114, the critical breakdown field is about 3.00 MV/cm. The critical breakdown field for a transistor implementing $Al_{0.1}Ga_{0.9}N$ is about 3.56 MV/cm, providing an increase of about 18%. These features are summarized in Table 1.

TABLE 1

Comparison of GaN and $Al_{0.1}Ga_{0.9}N$ in
Extrinsic Drain ($E_c \sim E_g^{2.5}$)

|  | Al % | Eg (eV) | Ec (MV/cm) |
|---|---|---|---|
| GaN | 0 | 3.4 | 3.00 |
| $Al_{0.1}Ga_{0.9}N$ | 10 | 3.64 | 3.56 |

In various embodiments, the breakdown voltage of transistor 100 including wide band gap material 104 may thereby be increased relative to a transistor of the same size having an extrinsic drain with GaN or the same breakdown voltage may be achieved with a smaller critical dimension of transistor 100, wherein the critical dimension is $L_{GD}$ (a length in the x-direction from the edge of gate 107 to the edge of intrinsic drain portion 105) as shown in FIG. 1B. For example, the formation of hetero junction 116 (e.g., GaN to $Al_{0.1}Ga_{0.9}N$) in extrinsic drain portion 114 may provide a wider band gap (e.g., an 18% larger critical breakdown field), which may provide an "extended" drain, achieving a larger breakdown voltage at the same $L_{GD}$ (as compared to a transistor implementing GaN in extrinsic drain portion 114).

In device implementations, transistor structure 150 may have a transistor pitch determined in part based on $L_{GD}$. For example, the transistor pitch may be defined as the distance between the centerline of openings 117 in the x-direction (or the centerline of intrinsic source portions 106 or any other similarly situated transistor landmarks). The pitch, W, in the x-direction may be given as the sum of twice the gate length (i.e., the length of gate 107 in the x-direction, $L_G$), twice the gate to intrinsic source length (i.e., the length between gate 107 and intrinsic source portion 106 in the x-direction, $L_{GS}$), twice $L_{GD}$ (as discussed), and twice the length of the intrinsic source (i.e. twice the length of intrinsic source in the x-direction, $T_{CN}$) such that: $W = 2 \times (L_G + L_{GS} + L_{GD} + T_{CN})$. Such dimensions are illustrated in FIG. 1B. As will be appreciated, decreasing $L_{GD}$ may thereby decrease the transistor pitch in various embodiments. In some examples, $L_G$ may be about 45-90 nm. In some examples, $L_{GS}$ may be about 7-10 nm. In some examples, $T_{CN}$ may be about 100-200 nm.

As discussed, increasing the band gap of extrinsic drain portion 114 may allow for a decreased transistor pitch, which may allow for smaller form factor devices. In some embodiments, a minimum $L_{GD}$ (e.g., lateral length of extrinsic drain portion 114) may be selected based on a predetermined breakdown voltage of transistor 100. For example, for a predetermined breakdown voltage of at least 10 V, a lateral length $L_{GD}$ of about 40 nm (and no more than 45 nm) may be implemented. For a predetermined breakdown voltage of at least 20 V, a lateral length $L_{GD}$ of about 80 nm (and no more than 85 nm) may be implemented.

Figure 1C:
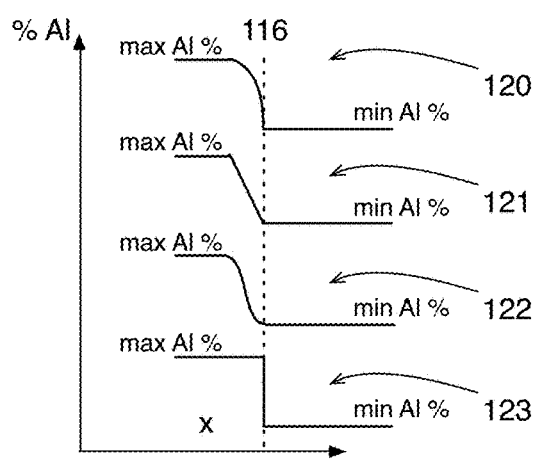
FIG. 1C illustrates example extrinsic drain hetero-junctions.

FIG. 1C illustrates example extrinsic drain hetero junctions, arranged in accordance with at least some implementations of the present disclosure. As shown in FIG. 1C, hetero junction 116 may be implemented using a variety of techniques. FIG. 1C illustrates example aluminum percentage profiles 120, 121, 122, 123. Each profile illustrates percentage of aluminum increasing from a minimum aluminum percentage (min Al %) to a maximum or bulk aluminum percentage (max Al %). In some examples, the minimum aluminum percentage may be 0% and the maximum aluminum percentage may be 10%, although embodiments are not restricted to a particular min or max percentage. FIG. 1C is not drawn to scale with respect to FIGS. 1A and 1B for the purposes of clarity of presentation.

As shown with respect to aluminum percentage profiles 120, 121, 122, in some examples, the aluminum profile at hetero junction 116 and in extrinsic drain portion 114 may include a graded aluminum profile linearly increasing to max Al %, increasing to max Al % in a curved manner having a decreasing rate, or increasing to max Al % with a sigmoidal shape. For example, extrinsic drain portion 114 may include a graded extrinsic drain portion having an increasing aluminum percentage from hetero junction 116 (e.g., the junction between channel 113) toward intrinsic drain portion 105. Such a relatively gradual addition of aluminum may aid in epitaxial growth by limiting the lattice mismatch between GaN and AlGaN, for example. However, such an implementation may slightly decrease effective $L_{GD}$ and/or the effective band gap of extrinsic drain portion 114 (as the amount of Al is decreased slightly). In some embodiments the rate of aluminum increase over lateral distance (e.g., in the x-direction) may be in the range of about 1%/50 nm (e.g., 0.02%/nm) to about 0.5%/1 nm (e.g., 0.5%/nm) (for example, an increase from 0% to 25% aluminum over 40 nm provides an aluminum increase rate of 0.625%/nm). A larger aluminum increase rate may provide increased break down voltage for transistor 100 but may disadvantageously decrease electron mobility and increase resistance.

In other examples, as shown with respect to aluminum percentage profile 122, the aluminum profile at hetero junction 116 and extrinsic drain portion 114 may include an abrupt aluminum profile such that extrinsic drain portion 114 fully transitions to max Al % at hetero-junction 116. Such a transition may offer the advantage of increased breakdown voltage increase (e.g., as effective $L_{GD}$, Al concentration, and band gap are increased or maximized). However, such a transition may cause difficulties with lattice mismatch and/or a current blocking, electron mobility decrease, or resistance increase at hetero junction 116.

As discussed, in some examples, wide band gap material 104 may include aluminum gallium nitride ($Al_xGa_{1-x}N$) such that the percentage of aluminum is about 10% (i.e., x=0.1) with a balance of gallium (e.g., $Al_{0.1}Ga_{0.9}N$). For example, wide band gap material 104 may include aluminum gallium nitride ($Al_xGa_{1-x}N$) such that the percentage of aluminum is no more than 10% (i.e., x=0.1) with a balance of gallium (e.g., $Al_{0.1}Ga_{0.9}N$). In some embodiments, the introduction of Al to GaN may increase the band gap of the material and a wider band gap material with respect to GaN may be any $Al_xGa_{1-x}N$ such that x is greater than zero with a balance of gallium. Although 10% of Al has been presented for exemplary purposes, any percentage of Al greater than zero may be used. In various embodiments x may be in the range of about 0.01 (e.g., 1% aluminum with a balance of gallium) to about 0.1 (e.g., 10% aluminum with a balance of gallium), about 0.05 (e.g., 5% aluminum with a balance of gallium) to about 0.25 (e.g., 25% aluminum with a balance of gallium), or about 0.1 (e.g., 10% aluminum with a balance of gallium) to about 0.4 (e.g., 40% aluminum with a balance of gallium). In some examples, providing greater percentages of Al may provide for a greater lattice mismatch to GaN. Such effects may be mitigated via a graded aluminum profile as discussed with respect to FIG. 1C.

As discussed, transistor 100 may include channel 113 coupled to gate 107. Gate 107 may include any suitable material or gate stack. In an embodiment, gate 107 may include a material stack including a dielectric, such as a non-epitaxial dielectric, proximal to channel 113. For example, gate 107 may include a high-k dielectric and metal gate. In such examples, transistor 100 may be considered a MOSFET. In some embodiments, gate 107 may not include a dielectric and transistor 100 may be a high-electron-mobility transistor (HEMT). In some embodiments, polarization layer 111 may be removed (e.g., via a suitable etch) under gate 107 to achieve enhancement mode (e.g., $V_{threshold}>0$ V) operation. For example, in such an embodiment, polarization layer 111 may be over extrinsic drain 114 and extrinsic source 113 but may have an opening over channel 113. In such an embodiment, gate 107 may be in contact with channel 113.

Also as discussed, intrinsic source portions 106 may be disposed over openings 117 in hardmask 102. As shown in FIG. 1B, in some examples, openings 117 may be fully under intrinsic source portions 106 (e.g., the width of openings 117 may be less than the width of intrinsic source portions 106). Such a configuration may provide the advantage that defects 109 may typically terminate either before or at intrinsic source portions 106 (e.g., as defects 109 typically run along vertical or horizontal glide planes). Such defect paths may not materially impact the operation of the device as, in operation, the voltage on intrinsic sources 106 may be held at 0 V.

Additional details associated with the described features of transistor structure 150 and/or transistor 100 are provided herein with respect to FIGS. 4A-4I, which discuss the formation of transistor structure 150 and transistor 100.

Figure 2A:
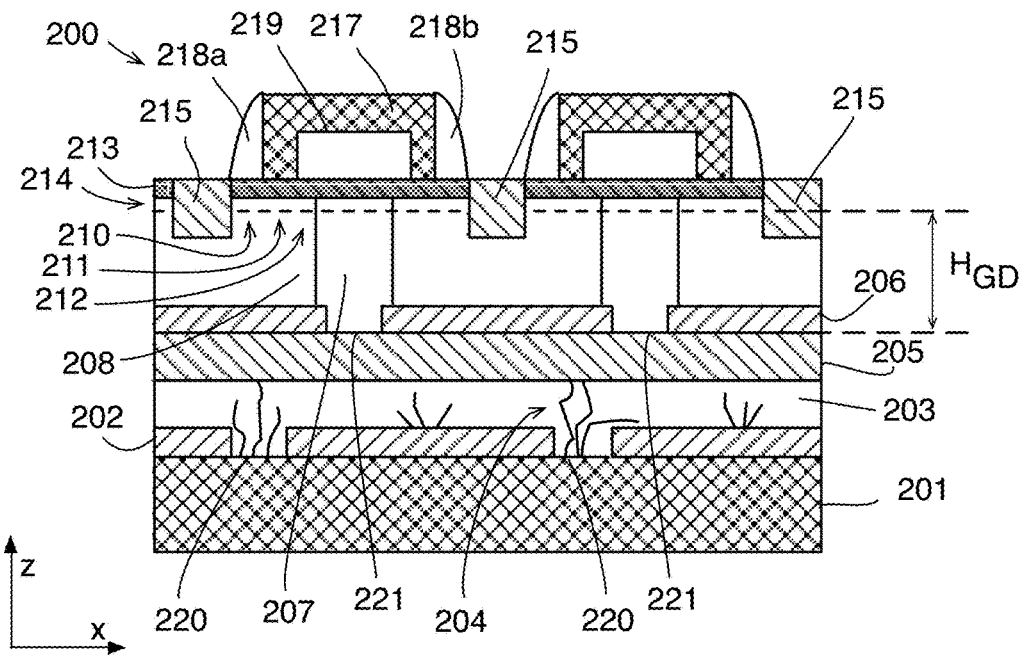
FIG. 2A is a side view of an example transistor structure including an example transistor.
Figure 2B:
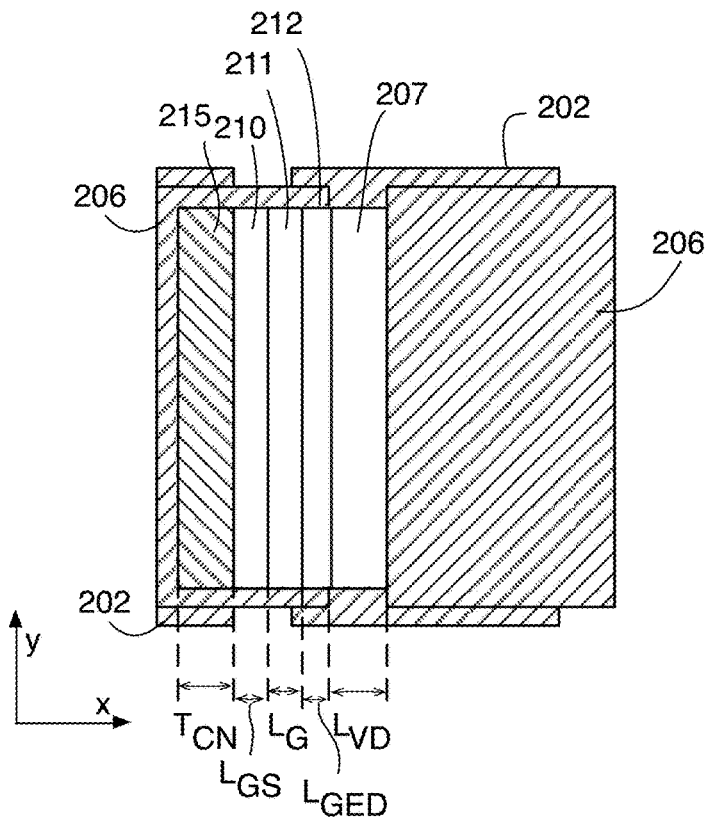
FIG. 2B is a plan view of the example transistor of the example transistor of FIG. 2A.

FIG. 2A is a side view of an example transistor structure 250 including an example transistor 200 and FIG. 2B is a plan view of portions of example transistor 200, arranged in accordance with at least some implementations of the present disclosure. In some cases, only features associated with exemplary transistor 200 are labeled for the sake of clarity of presentation. As shown in FIG. 2A, transistor structure 250 may include a substrate 201, a hardmask 202 including openings 220, a epitaxial III-N material layer 203, intrinsic drain portion 205, a hardmask 206 including openings 221, vertical extrinsic drain portions 207, and epitaxial III-N material regions 208. Epitaxial III-N material layer 203 may include defects (e.g., glide defects) 204, for example.

Also as shown, transistor structure 250 may include intrinsic source portions 215. In some embodiments, adjacent transistors may share an intrinsic source as shown. Further, as discussed, the term "source" is meant to indicate a structure including an intrinsic source (or intrinsic source portion) and/or an extrinsic source (or extrinsic source portion). Similarly, the term "drain" is meant to indicate a structure including an intrinsic drain (or intrinsic drain portion) and/or an extrinsic drain (or extrinsic drain portion). As such, transistor 200 may include a source including exemplary intrinsic source portion 215 and an extrinsic source portion 210 (in FIG. 2A, only one extrinsic source portion is labeled for the sake of clarity). Similarly, transistor 200 may include a drain including intrinsic drain portion 205 and an extrinsic drain portion including vertical extrinsic drain portion 207 and extended extrinsic drain portion 212. As used herein with respect to the drain of transistor 100, the term extended indicates the portion of the drain between vertical extrinsic drain portion 207 and channel 211 (e.g., the portion extending laterally from vertical extrinsic drain portion 207 to channel 211).

As shown, transistor 200 may include a channel 211 comprising the III-N material of epitaxial III-N material regions 208 (e.g., GaN) between extrinsic source portion 210 and extended extrinsic drain portion 212. Channel 211 may be gate coupled via gate 217. As shown, in some examples, gate 217 may service two transistor channels.

Furthermore, transistor 200 may include sidewall spacers 218a, 218b and intra-gate spacer 219. Also as shown in FIG. 2A, transistor structure 250 may include a polarization layer 213 over channel 211, extrinsic source 210, extended extrinsic drain portion 212, and vertical extrinsic drain portion 207. Polarization layer 213 may include any material, materials, or material stack that may provide a 2D electron gas 214 as discussed herein. For example, polarization layer 213 may be aluminum nitride (AlN), aluminum indium nitride (AlInN), or aluminum gallium nitride (AlGaN), or any combination thereof.

As shown in FIG. 2A, transistor 200 may include hardmask 206 disposed over substrate 201, and hardmask 206 may include openings 221. Transistor 200 may also include a source (optionally including extrinsic source portion 210 and intrinsic source portion 215), a drain (including intrinsic drain portion 205, vertical extrinsic drain portion 207, and extended extrinsic drain portion 212), and a gate (e.g., gate 217) coupled channel 211 between the source and the drain. As discussed, channel 211 may comprise gallium nitride. Channel 211 may be disposed over hardmask 206 and the extrinsic drain portion (e.g., including vertical extrinsic drain portion 207 and extended extrinsic drain portion 212) may be proximal to channel 211 and intrinsic drain portion 210 may be distal to channel 211. Transistor 200 may also include polarization layer 213 disposed over at least the extrinsic drain portion (e.g., including vertical extrinsic drain portion 207 and extended extrinsic drain portion 212) and channel 211. Polarization layer 213 may be disposed under sidewall spacers 218a, 218b. As shown in FIG. 2A, at least a portion of the drain (e.g., vertical extrinsic drain portion 207) may be disposed over opening 221 of hardmask 202.

Continuing with FIG. 2A, vertical extrinsic drain portion 207 may be vertically oriented such that it extends vertically from extended extrinsic drain portion 212 to intrinsic drain portion 205. Furthermore, intrinsic drain portion 205 may be disposed under hardmask 206 and may extend laterally under hardmask 206 such that it may be accessed by multiple transistors. In an embodiment, intrinsic drain portion 205 may be contacted by a via or contact or the like, which is not shown for the sake of clarity of presentation. Furthermore, intrinsic drain portion may be advantageously shorted using the configuration illustrated in FIG. 2A. By orienting vertical extrinsic drain portion 221 in such a manner, no area penalty is incurred for vertical extrinsic drain portion 207 or intrinsic drain portion 205. Furthermore, the breakdown voltage of transistor 200 may be increased by increasing the vertical length (e.g., height) of vertical extrinsic drain portion 207 as shown via $H_{GD}$ in FIG. 2A. As shown, vertical length $H_{GD}$ may be the length of vertical extrinsic drain portion 207 beginning at about the bottom of extended extrinsic drain portion 212 and extending to the top of intrinsic drain portion 205. In an embodiment, the breakdown voltage of transistor 200 may be varied based on $H_{GD}$. For example, for a predetermined breakdown voltage of at least 5 V, a vertical length $H_{GD}$ of about 20 nm (and no more than 25 nm) may be implemented. For a predetermined breakdown voltage of at least 10 V, a vertical length $H_{GD}$ of about 40 nm (and no more than 45 nm) may be implemented. For example, for a predetermined breakdown voltage of at least 100 V, a vertical length $H_{GD}$ of about 400 nm (and no more than 440 nm) may be implemented. For example, for a predetermined breakdown voltage of at least 1,000 V, a vertical length $H_{GD}$ of about 1-2 microns (and no more than 2.5 microns) may be implemented.

In some embodiments, vertical extrinsic drain portion 207 may include a wide band gap material (as compared to epitaxial III-N material regions 208) such as $Al_xGa_{1-x}N$ as discussed respect to transistor 100 and elsewhere herein. Such embodiments may offer the advantage of increased breakdown voltage for transistor 200 but may offer the disadvantage lattice mismatch. Furthermore, a wide band gap material such as, for example, $Al_{0.83}In_{0.17}N$ may be lattice-matched to GaN, but may offer the disadvantage of lower electron mobility and a large conduction band offset that may block current. The wide band gap material may contain any material or composition as discussed herein with respect to wide band gap material regions 104 and may include any hetero junction profile as discussed with respect to FIG. 1C.

Transistor structure 250 may have a transistor pitch, W, which may be independent of and advantageously not include $H_{GD}$. For example, referring to FIG. 2B, the transistor pitch may be defined as the distance between the centerline of vertical extrinsic drain portions 207 in the x-direction (or the centerline of intrinsic sources 215 or any other similarly situated transistor landmarks). The pitch, W, in the x-direction may be given as the sum of the length of the intrinsic source (i.e. the length of intrinsic source 210 in the x-direction, $T_{CN}$), the gate to intrinsic source length (i.e., the length between gate 217 and intrinsic source 210 in the x-direction, $L_{GS}$), twice the effective gate lengths (i.e., the lengths of the portions of gate 217 over the channels, in the x-direction, $L_G$), twice the gate to vertical extrinsic drain portions 207 (i.e., the length of the extended extrinsic drain portion 212, in the x-direction, $L_{GED}$), and the length of vertical extrinsic drain portion 207 (i.e., the length of vertical extrinsic drain portion 207 in the x-direction, $L_{VD}$) such that: $W = T_{CN} + L_{GS} + 2 \times L_G 2 \times L_{GED} + L_{VD}$.

As discussed, providing vertical extrinsic drain portions 207 may allow for a decreased transistor pitch, which may allow for smaller form factor devices.

As discussed, transistor 200 may include channel 211 coupled to gate 217. As shown, in some examples, gate 217 may be a dual gate such that it is operable to two transistors. Gate 217 may include any suitable material or gate stack. In an embodiment, gate 217 may include a material stack including a dielectric, such as a non-epitaxial dielectric, proximal to channel 211. For example, gate 217 may include a high-k dielectric and metal gate. In such examples, transistor 200 may be considered a MOSFET. In some embodiments, gate 217 may not include a dielectric and transistor 200 may be a high-electron-mobility transistor (HEMT). As shown, gate 217 may include intra gate spacer 219 which may contain any suitable insulating material such as an oxide or the like. In some embodiments, polarization layer 213 may be removed (e.g., via a suitable etch) under gate 217 to achieve enhancement mode (e.g., $V_{threshold} > 0$ V) operation. For example, in such an embodiment, polarization layer 213 may be over extrinsic drain 207 and extrinsic source 210 but may have an opening over channel 211. In such an embodiment, gate 217 may be in contact with channel 211.

As shown, intra-gate spacer 219 may be slightly wider than extrinsic drain portion 207 such that some under-lapping (e.g., the outside edges of extrinsic drain portion 207 being under the outside edges of intra-gate spacer 219) may be present. Such under-lapping may be advantageous to improve breakdown handling under high drain bias, for example.

Additional details associated with the described features of transistor structure 250 and/or transistor 200 are provided herein with respect to FIGS. 5A-5L, which discuss the formation of transistor structure 250 and transistor 200.

Furthermore, transistor 100 or transistor 200 may be implemented in an electronic device structure comprising a system on a chip. For example, the structure may include a silicon Complementary Metal Oxide Semiconductor (CMOS) circuit portion 102, a III-N material based device portion 103, an other device portions, implemented on a substrate. The III-N material based devices (e.g., transistor 100 or transistor 200) may be formed on III-N material regions that are formed on, over, or within the substrate. For example, the substrate may be silicon as discussed herein. The III-N material regions may be formed adjacent to CMOS circuit portions based on device requirements for example.

Although illustrated with respect to structures having lateral and/or planar channels, the techniques discussed herein may be extended to vertically oriented MOSFET devices, tunnel field effect transistors (TFET), or the like. Such implementations may have the advantage of using lateral overgrowth epitaxy using full free surface relaxation to reduce defects during growth.

Figure 3:
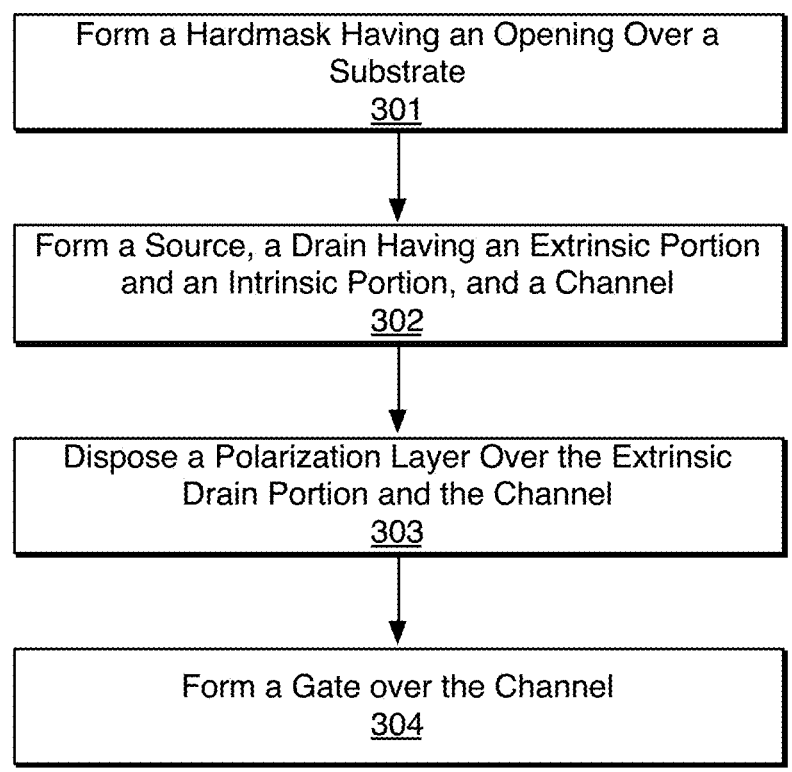
FIG. 3 is a flow diagram illustrating an example process for forming a transistor having enhanced breakdown voltage.

FIG. 3 is a flow diagram illustrating an exemplary method 300 for forming a transistor having enhanced breakdown voltage, arranged in accordance with at least some implementations of the present disclosure. For example, method 300 may be implemented to fabricate transistor 100 or transistor 200 as discussed herein. In the illustrated implementation, process 500 may include one or more operations as illustrated by operations 301-304. However, embodiments herein may include additional operations, certain operations being omitted, or operations being performed out of the order provided.

Method 300 may begin at operation 301, "Form a Hardmask Having an Opening Over a Substrate", where a hardmask having an opening made be formed over a substrate. In an embodiment, hardmask 102 may be formed over substrate 101 as is discussed further with respect to FIG. 4A and elsewhere herein. In an embodiment, hardmask 206 may be formed over substrate 201 as is discussed further with respect to FIG. 5D and elsewhere herein.

Method 300 may continue at operation 302, "Form a Source, a Drain Having an Extrinsic Portion and an Intrinsic Portion, and a Channel", where a source, a drain having an extrinsic portion and an intrinsic portion, and a channel may be formed. In an embodiment, a source (including intrinsic source portion 106 and extrinsic source portion 115), a drain (including intrinsic drain portion 105 and extrinsic drain portion 114), and channel 113 may be formed over substrate 101 as is discussed further with respect to FIG. 4I and elsewhere herein. In an embodiment, a source (including intrinsic source portion 215 and extrinsic source portion 210), a drain (including intrinsic drain portion 205, extended extrinsic drain portion 212, and vertical extrinsic drain portion 207), and channel 211 may be formed over substrate 201 as is discussed further with respect to FIG. 5L and elsewhere herein.

Method 300 may continue at operation 303, "Dispose a Polarization Layer Over the Extrinsic Drain Portion and the Channel", where a polarization layer may be disposed over the extrinsic drain portion and the channel. In an embodiment, polarization layer 111 may be disposed over extrinsic drain portion 114 and channel 113 as is discussed further with respect to FIG. 4H and elsewhere herein. In an embodiment, polarization layer 213 may be disposed over the extrinsic drain portion (including extended extrinsic drain portion 212 and vertical extrinsic drain portion 207) and channel 211 as is discussed further with respect to FIG. 5K and elsewhere herein.

Method 300 may continue at operation 304, "Form a Gate over the Channel", where a gate may be formed over the channel. In an embodiment, gate 107 may be formed over channel 113 as is discussed further with respect to FIG. 4I and elsewhere herein. In an embodiment, gate 217 may be formed over channel 211 as is discussed further with respect to FIG. 5L and elsewhere herein.

As discussed, method 300 may be implanted to fabricate transistor 100 or transistor 200. Further details associated with such fabrication techniques are discussed herein an in particular, with respect to FIGS. 4A-4I for the fabrication of transistor 100 and with respect to FIGS. 5A-5L for the fabrication of transistor 200. Any one or more of the operations of method 300 (or the operations discussed herein with respect to FIGS. 4A-4I or FIGS. 5A-5L) may be undertaken in response to instructions provided by one or more computer program products. Such program products may include signal bearing media providing instructions that, when executed by, for example, a processor, may provide the functionality described herein. The computer program products may be provided in any form of computer readable medium. Thus, for example, a processor including one or more processor core(s) may undertake one or more of the described operations in response to instructions conveyed to the processor by a computer readable medium.

Figure 4A:
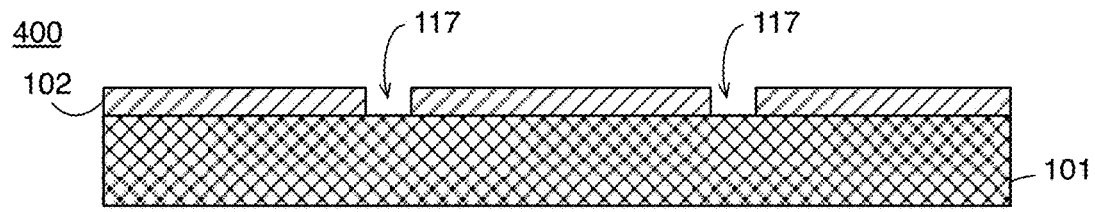
FIGS. 4A, 4B, 4C, 4D, 4E, 4F, 4G, and 4I are side views of example transistor structures as particular fabrication operations are performed.

FIGS. 4A-4I are side views of example transistor structures as particular fabrication operations are performed, arranged in accordance with at least some implementations of the present disclosure. As shown in FIG. 4A, transistor structure 400 includes a substrate 101. For example, substrate 101 may be a substrate substantially aligned along a predetermined crystal orientation (e.g., (100), (111), (110), or the like). In some examples, substrate 101 may include a semiconductor material such as monocrystalline silicon (Si), germanium (Ge), silicon germanium (SiGe), a III-V materials based material (e.g., gallium arsenide (GaAs)), a silicon carbide (SiC), a sapphire ($Al_2O_3$), or any combination thereof. In some examples, substrate 101 may include silicon having a (100) crystal orientation with a 4°-11° miscut (with 4°-6° being particularly advantageous). Examples using silicon having a crystal orientation of (110) may offer the advantage of having a smaller mismatch for subsequent epitaxial growth. In various examples, substrate 101 may include metallization interconnect layers for integrated circuits or electronic devices such as transistors, memories, capacitors, resistors, optoelectronic devices, switches, or any other active or passive electronic devices separated by an electrically insulating layer, for example, an interlayer dielectric, a trench insulation layer, or the like.

Also as shown in FIG. 4A, hardmask 102 including openings 117 may be formed over substrate 101. Hardmask 102 may include any material selective to the subsequently formed epitaxial III-N materials. For example, hardmask 102 may include silicon oxide, silicon nitride, silicon oxynitride, aluminum oxide, or the like. The positions of openings 117 may define the approximate centerline for subsequently formed epitaxial III-N materials, a distance between intrinsic sources, a pitch of transistors, and/or the positions of glide defects. Hardmask 102 may have any suitable thickness such as for example, 100-200 nm. Hardmask 102 may be formed using any suitable technique or techniques. For example, hardmask 102 may deposited using a blanket deposition techniques such as chemical vapor deposition (CVD), plasma Enhanced chemical vapor deposition (PECVD), physical vapor deposition (PVD), molecular beam epitaxy (MBE), metalorganic chemical vapor deposition (MOCVD), atomic layer deposition (ALD), or the like, and the openings 117 may be formed and/or patterned using photolithographic and etch based techniques.

Figure 4B:
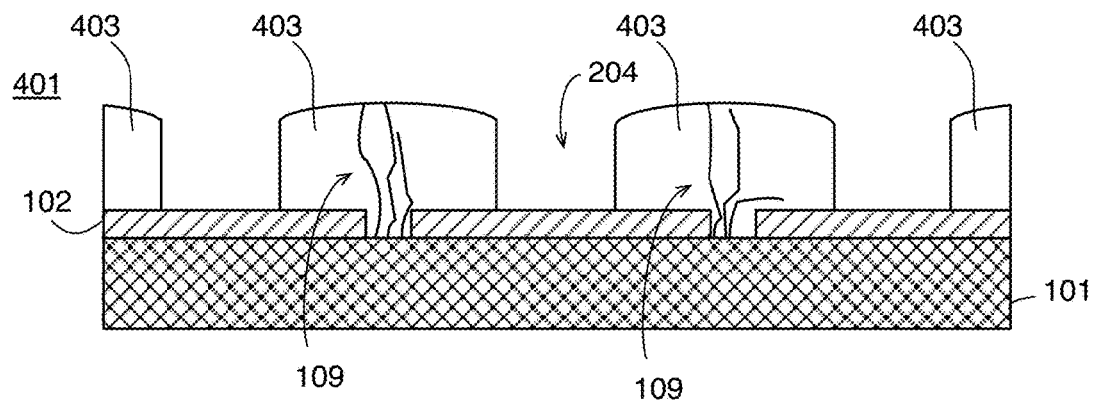

FIG. 4B illustrates a transistor structure 401 similar to transistor structure 400, after the epitaxial growth of epitaxial III-N bumps 403. Epitaxial III-N bumps 403 may be formed using any suitable epitaxial growth technique such as, for example, an epitaxial growth via chemical vapor deposition (CVD), metal organic chemical vapor deposition (MOCVD), atomic layer deposition (ALD), or any other epitaxial growth technique, with MOCVD being particularly advantageous. Epitaxial III-N bumps 403 may include any suitable III-N material such as, for example, GaN. Furthermore, epitaxial III-N bumps 403 may be any suitable thickness such as, for example, 100-500 nm. In some examples, the thickness of epitaxial III-N bumps 403 may be determined based on a final thickness for the epitaxial III-N materials such that a top rounded portion of epitaxial III-N bumps 403 may be removed and a final design parameter may be met.

As shown, epitaxial III-N bumps 403 may include defects 109 such as, for example, glide defects. Glide defects may run along glide planes that are typically in the vertical or horizontal direction. In some examples, the placement of openings 117 may be associated with defects 109 and (with reference to FIG. 1A) as discussed above, the placement of intrinsic source portions may be substantially aligned with openings 117. Such alignment may provide for defects 109 terminating at intrinsic source portions 106 such that defects 109 extend between intrinsic sources 106 and substrate 117. Such defect paths may not materially impact the operation of the device as, in operation, the voltage on intrinsic source portions 106 is held at 0 V. In some embodiments, epitaxial III-N bumps 403 may include rounded top surfaces as illustrated. In other embodiments, epitaxial III-N bumps 403 may include substantially flat surfaces such that optional subsequent planarization operations may not be implemented.

In some embodiments, prior to epitaxial growth of epitaxial III-N bumps 403, a surface preparation may be performed on substrate 101. For example, a trench may be formed in substrate 101 at opening 117. The trench may include a trench shape such as a V-groove exposing a silicon surface of orientation {111} and may include a miscut, and/or dimensions to facilitate the epitaxial growth of epitaxial III-N bumps 403.

Figure 4C:
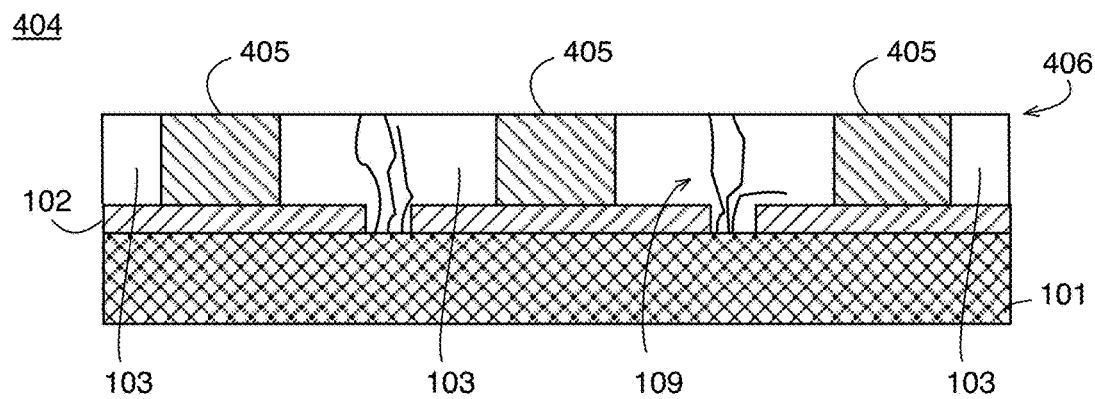

FIG. 4C illustrates a transistor structure 404 similar to transistor structure 401, after a backfill operation and optional planarization operation. As shown in FIG. 4C, backfill materials 405 may be provided between epitaxial III-N material regions 103 and an optional planarization may be performed to provide a substantially planar surface 406. Backfill materials 405 may include any material with etch selectivity with respect to epitaxial III-N material regions 103 such that backfill materials 405 may be subsequently removed. The planarization operation may include any suitable technique or technique such as a chemical-mechanical polishing operation and, as discussed, in some embodiments, a planarization operation may not be employed. Epitaxial III-N material regions 103 may have any suitable thickness such as, for example, 100-500 nm, as discussed.

Figure 4D:
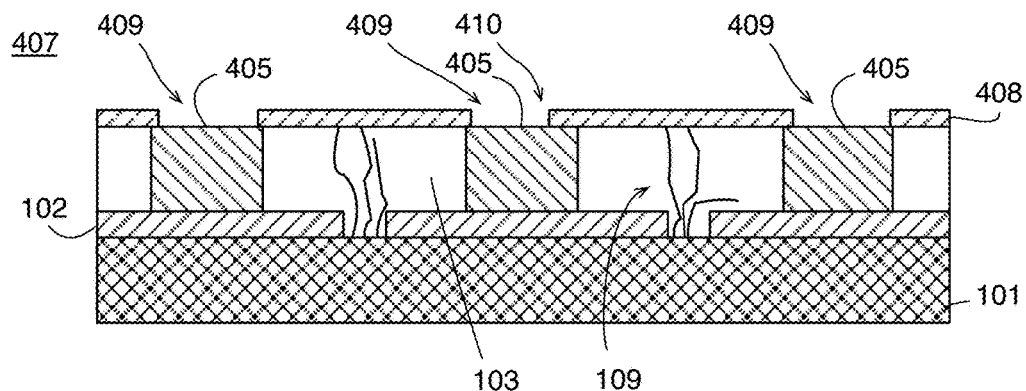

FIG. 4D illustrates a transistor structure 407 similar to transistor structure 404, after the formation of a hardmask 408. As shown in FIG. 4D, hardmask 408 may be formed and patterned such that hardmask 408 includes openings 409 substantially aligned with backfill materials 405. Hardmask 408 may include any material that is epitaxially selective with respect to epitaxial III-N material regions 103 such that a subsequent wider band gap material may be epitaxially grown from epitaxial III-N material regions 103 but not from hardmask 408. For example, any material discussed with respect to hardmask 102 (e.g., silicon oxide, silicon nitride, silicon oxynitride, aluminum oxide, or the like) may be used. As shown in FIG. 4D, one or more overhangs 410 may be permissible and possibly advantageous as they may limit the growth of subsequent epitaxial materials. Hardmask 408 may be formed using any suitable technique or techniques such as using a blanket deposition techniques such as CVD, PECVD, PVD, MBE, MOCVD, ALD, or the like, and the openings 409 may be formed and/or patterned using photolithographic and etch based techniques.

Figure 4E:
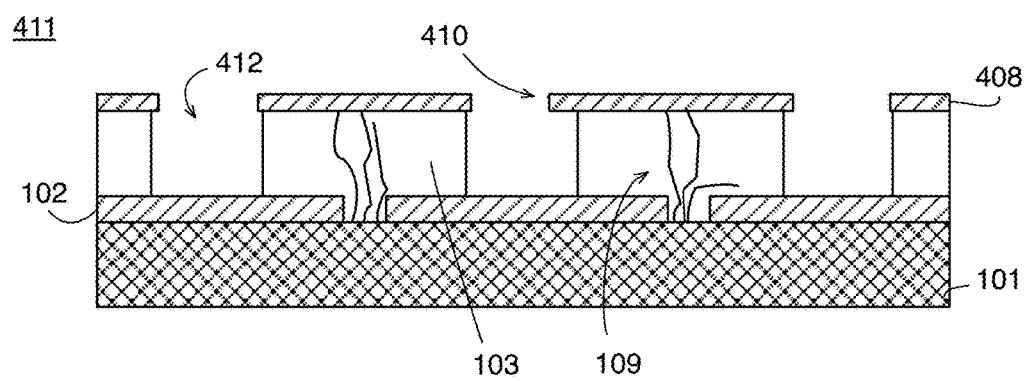

FIG. 4E illustrates a transistor structure 411 similar to transistor structure 407, after the removal of backfill materials 405 to expose openings 412. Backfill materials 405 may be removed using any suitable technique such as an etch operation or the like.

Figure 4F:
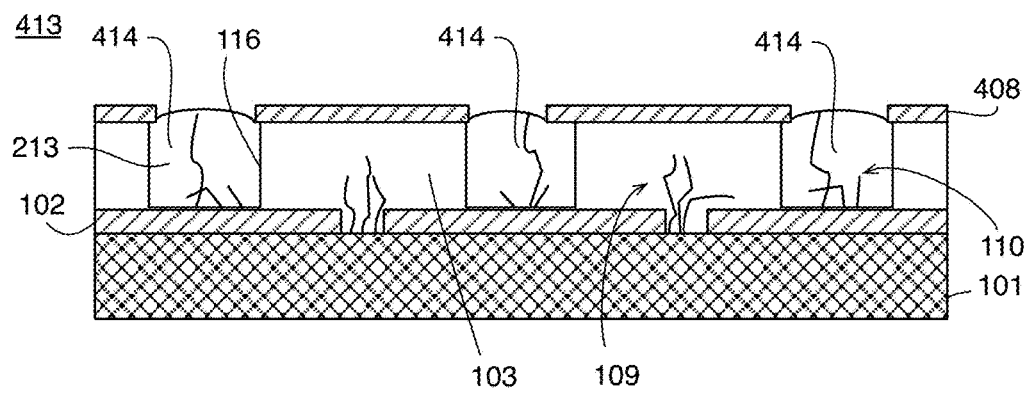

FIG. 4F illustrates a transistor structure 413 similar to transistor structure 411, after a lateral epitaxial growth of wider band gap material bumps 414. Wider band gap material bumps 414 may be formed via a lateral epitaxial growth via epitaxial III-N material regions 103. Wider band gap material bumps 414 may include any suitable material or materials such as, for example, AlGaN. Wider band gap material bumps 414 may be formed using any suitable epitaxial growth technique such as, for example, an epitaxial growth via chemical vapor deposition, metal organic chemical vapor deposition, atomic layer deposition, or any other epitaxial growth technique. As discussed above with respect to FIG. 1C, in various embodiments, the subsequently formed wide band gap material regions 104 and associated extrinsic drain portions 114 may have an aluminum percentage profiles at hetero junction 116. In some embodiments, wider band gap material bumps 414 may be laterally epitaxially grown to provide a linear graded extrinsic drain portion, a curved graded extrinsic drain portion with a decreasing slope, or an abrupt transition drain portion.

As shown, in some implementations, wider band gap material bumps 414 may have a curved top surface. In other implementations, wider band gap material bumps 414 may have a substantially flat top surface such that no subsequent planarization operation is needed.

Figure 4G:
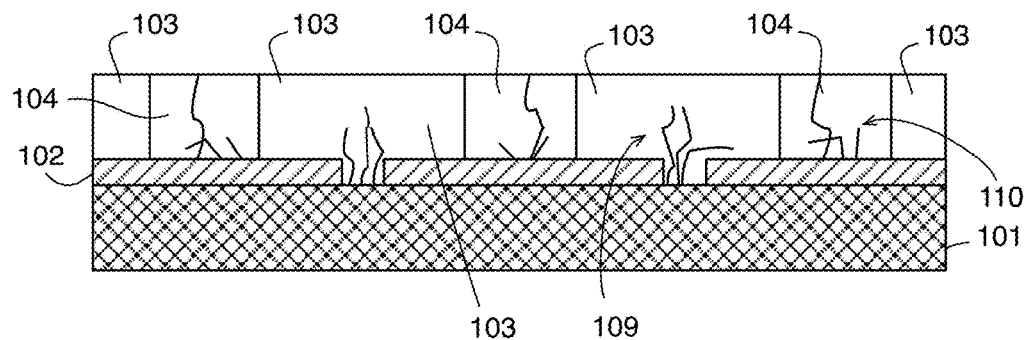

FIG. 4G illustrates a transistor structure 415 similar to transistor structure 413, after the removal of hardmask 408 and an optional planarization operation. Hardmask 408 may be removed using any suitable technique such as, for example, an etch or strip operation and the optional planarization operation, if needed, may include any suitable technique or techniques such as a chemical-mechanical planarization or the like.

Figure 4H:
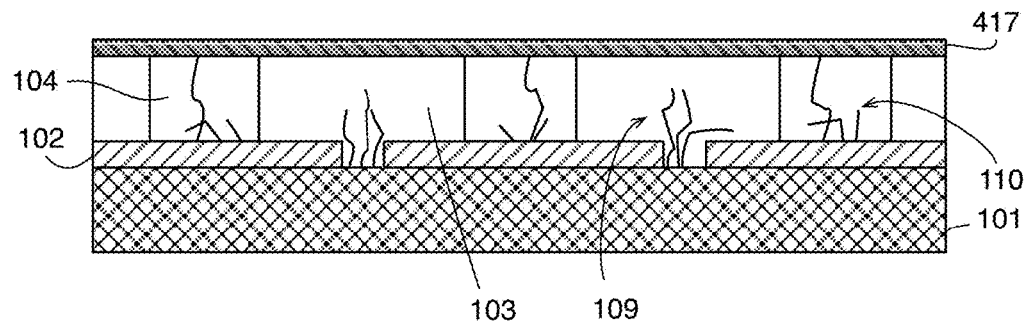

FIG. 4H illustrates a transistor structure 416 similar to transistor structure 415, after the epitaxial growth of polarization layer 417. Polarization layer 417 may include any material or material stacks that may provide a 2D electron gas in epitaxial III-N material regions 103 and/or epitaxial wider band gap material regions 104. For example, as discussed, polarization layer 417 may be AlN, AlInN, or AlGaN, or any combination thereof. Polarization layer 417 may be formed using any suitable epitaxial growth technique such as, for example, an epitaxial growth via chemical vapor deposition, metal organic chemical vapor deposition, atomic layer deposition, or any other epitaxial growth technique.

Figure 4I:
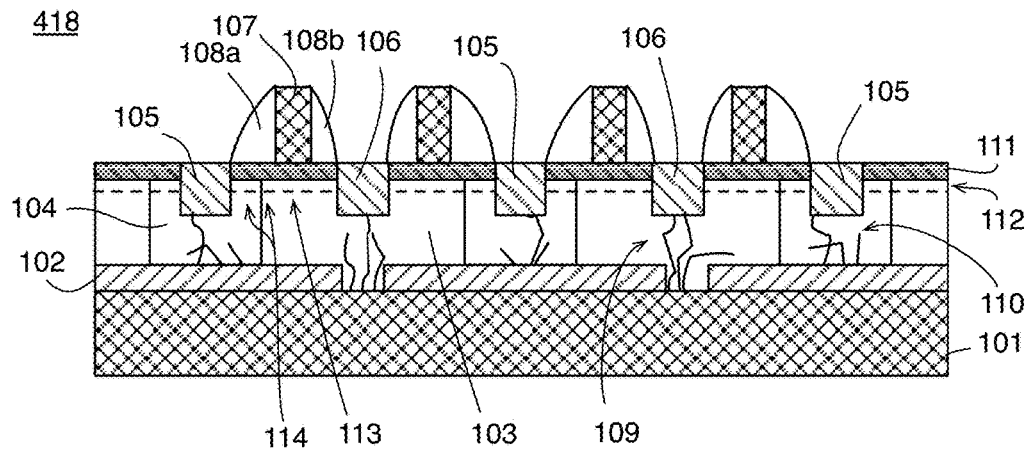

FIG. 4I illustrates a transistor structure 418 similar to transistor structure 416, after the formation of intrinsic drain portions 105, intrinsic source portions 106, exemplary gate 107, and exemplary sidewall spacers 108a, 108b. The formation of intrinsic drain portions 105 and intrinsic source portions 106 may include, for example, a patterning operation, an etch operation, and an epitaxial re-growth operation generating intrinsic drain portions 105 and intrinsic source portions 106. In an embodiment, intrinsic drain portions 105 and intrinsic source portions 106 include an N+ material. In an embodiment, intrinsic drain portions 105 and intrinsic source portions 106 include indium gallium nitride with less than about 10% indium doped with silicon. Gate 107 and sidewall spacers 108a, 108b may be formed using standard fabrication techniques. Gate 107 may include any suitable gate stack either including a dielectric, such as a non-epitaxial dielectric, proximal to channel 113 or a stack without a dielectric such as in a HEMT implementation. To achieve enhancement-mode operation as discussed, polarization layer 111 may be removed from under gate 107 prior to a high-k dielectric deposition.

Figure 5A:
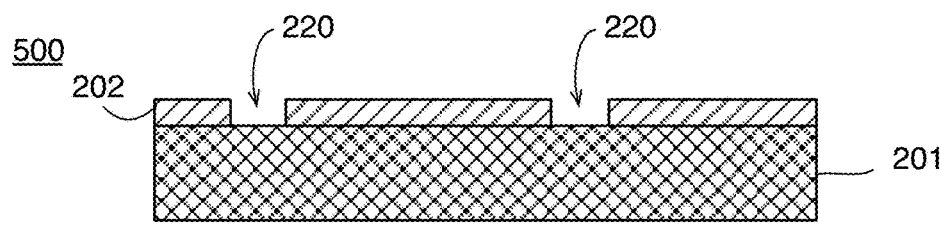
FIGS. 5A, 5B, 5C, 5D, 5E, 5F, 5G, 5H, 5I, 5J, 5K, and 5L are side views of example transistor structures as particular fabrication operations are performed.

FIGS. 5A-5L are side views of example transistor structures as particular fabrication operations are performed, arranged in accordance with at least some implementations of the present disclosure. As shown in FIG. 5A, transistor structure 500 includes a substrate 201. For example, substrate 201 may be a substrate substantially aligned along a predetermined crystal orientation (e.g., (100), (111), (110), or the like). In some examples, substrate 201 may include a semiconductor material such as monocrystalline Si, Ge, SiGe, a III-V materials based material (e.g., GaAs), a SiC, a sapphire, or any combination thereof. In some examples, substrate 201 may include silicon having a (100) crystal orientation with a 4°-11° miscut (with 4°-6° being particularly advantageous). Examples using silicon having a crystal orientation of (110) may offer the advantage of having a smaller lattice and may thereby provide a smaller mismatch for subsequent epitaxial growth. In various examples, substrate 101 may include metallization interconnect layers for integrated circuits or electronic devices such as transistors, memories, capacitors, resistors, optoelectronic devices, switches, or any other active or passive electronic devices separated by an electrically insulating layer, for example, an interlayer dielectric, a trench insulation layer, or the like.

Also as shown in FIG. 5A, hardmask 202 including openings 220 may be formed over substrate 201. Hardmask 202 may include any material selective to the subsequently formed epitaxial III-N materials. For example, hardmask 202 may include silicon oxide, silicon nitride, silicon oxynitride, aluminum oxide, or the like. The positions of openings 220 may be offset with respect to openings 221 of hardmask 206 (please refer to FIG. 2A) such that any defects in a subsequently formed epitaxial III-N material may be isolated under hardmask 206 and may not impact epitaxial III-N material regions 208 and the associate devices. Such a two stage epitaxial growth (e.g., lateral epitaxial growth or overgrowth) of epitaxial III-N material layer 203 and epitaxial III-N material regions 208 (please again refer to FIG. 2A) may provide for very low defects in vertical extrinsic drain portions 207, where any defects may diminish the performance of the device, particularly at high voltages. For example, opening 220 may be laterally offset from the vertical extrinsic drain portion by one fourth of the transistor pitch discussed above (e.g., a distance between the vertical extrinsic drain portion and a second vertical extrinsic drain portion).

Hardmask 202 may have any suitable thickness such as for example, 100-200 nm. Hardmask 202 may be formed using any suitable technique or techniques. For example, hardmask 202 may deposited using a blanket deposition techniques such as chemical vapor deposition, plasma Enhanced chemical vapor deposition, physical vapor deposition, molecular beam epitaxy, metalorganic chemical vapor deposition, atomic layer deposition, or the like, and the openings 220 may be formed and/or patterned using photolithographic and etch based techniques.

Figure 5B:
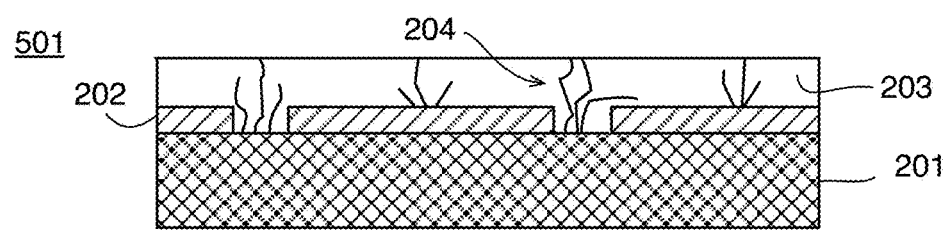

FIG. 5B illustrates a transistor structure 501 similar to transistor structure 500, after the epitaxial growth of epitaxial III-N material layer 203. Epitaxial III-N material layer 203 may be formed using any suitable epitaxial growth technique such as, for example, an epitaxial growth via chemical vapor deposition, metal organic chemical vapor deposition, atomic layer deposition, or any other epitaxial growth technique. Epitaxial III-N material layer 203 may include any suitable III-N material such as, for example, GaN. Furthermore, epitaxial III-N material layer 203 may be any suitable thickness such as, for example, 100-500 nm.

As shown, epitaxial III-N material layer 203 may include defects 204 such as, for example, glide defects which may run along glide planes that are typically in the vertical or horizontal direction. As discussed above, the placement of openings 220 may be predetermined to eliminate or reduce the effect of defects 204. As shown, in some embodiments, epitaxial III-N material layer 203 may include a substantially flat top surface after epitaxial growth. In other embodiments, epitaxial III-N material layer 203 may be planarized prior to further processing. In some embodiments, prior to epitaxial growth of epitaxial III-N material layer 203, a surface preparation may be performed on substrate 201. For example, a trench may be formed in substrate 201 at openings 220. The trench may include a trench shape such as a V-groove and may include a miscut, and/or dimensions to facilitate the epitaxial growth of epitaxial III-N material layer 203.

Figure 5C:
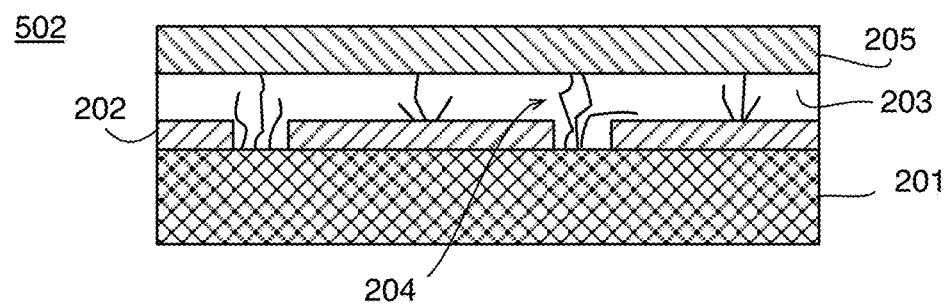

FIG. 5C illustrates a transistor structure 502 similar to transistor structure 501, after the epitaxial growth of intrinsic drain portion 205. The formation of intrinsic drain portion 205 may include an epitaxial growth operation. For example, the epitaxial growth may include chemical vapor deposition, metal organic chemical vapor deposition, atomic layer deposition, or any other epitaxial growth technique. In an embodiment, intrinsic drain portion 205 includes an N+ material. In an embodiment, intrinsic drain portion 205 includes indium gallium nitride with less than about 10% indium, doped with silicon. As shown FIG. 2B, intrinsic drain portion 205 may provide a drain for multiple transistors and may be disposed under a subsequently formed hardmask as discussed below.

Figure 5D:
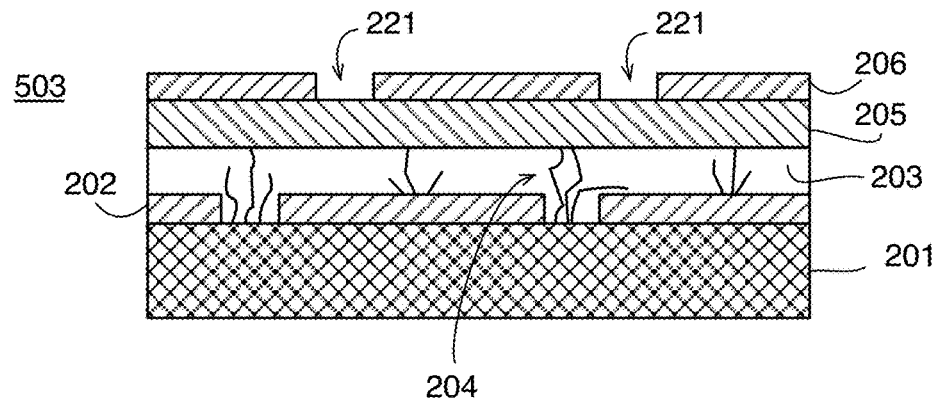

FIG. 5D illustrates a transistor structure 503 similar to transistor structure 502, after the formation of hardmask 206 having openings 221. Hardmask 206 may include any material selective to the subsequently formed epitaxial III-N materials such as, for example, silicon oxide, silicon nitride, silicon oxynitride, aluminum oxide, or the like. The positions of openings 221 may be offset with respect to openings 220 of hardmask 202 as discussed such that 204 at openings 220 may be isolated under hardmask 206 and may not impact subsequently formed epitaxial III-N material regions and the associated devices. Hardmask 206 may have any suitable thickness such as for example, 100-200 nm. Hardmask 206 may be formed using any suitable technique or techniques. For example, hardmask 206 may deposited using a blanket deposition techniques such as chemical vapor deposition, plasma Enhanced chemical vapor deposition, physical vapor deposition, molecular beam epitaxy, metalorganic chemical vapor deposition, atomic layer deposition, or the like, and the openings 221 may be formed and/or patterned using photolithographic and etch based techniques.

Figure 5E:
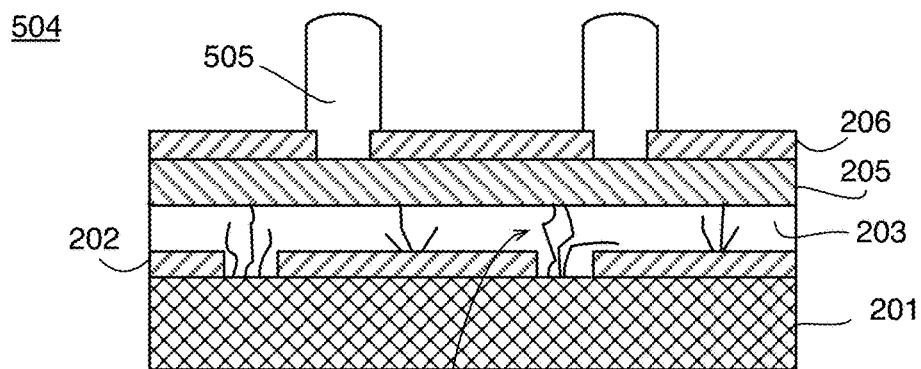

FIG. 5E illustrates a transistor structure 504 similar to transistor structure 503, after the epitaxial growth of epitaxial III-N bumps 505. Epitaxial III-N bumps 505 may be formed using any suitable epitaxial growth technique such as, for example, an epitaxial growth via chemical vapor deposition, metal organic chemical vapor deposition, atomic layer deposition, or any other epitaxial growth technique. Epitaxial III-N bumps 505 may include any suitable III-N material such as, for example, GaN, AlGaN or both with a hetero junction there between as discussed herein. Furthermore, epitaxial III-N bumps 505 may be any suitable thickness such as, for example, 40 nm-2 microns. For example, the thickness of epitaxial III-N bumps 505 may be selected based on a predetermined breakdown voltage of transistor 200 or such that after further planarization processing the thickness of vertical extrinsic drain portion 207 has a desired thickness or the like. As shown in FIG. 5E, epitaxial III-N bumps 505 may grow out of the openings in hardmask 206 laterally and overlap portions of hardmask 206.

Figure 5F:
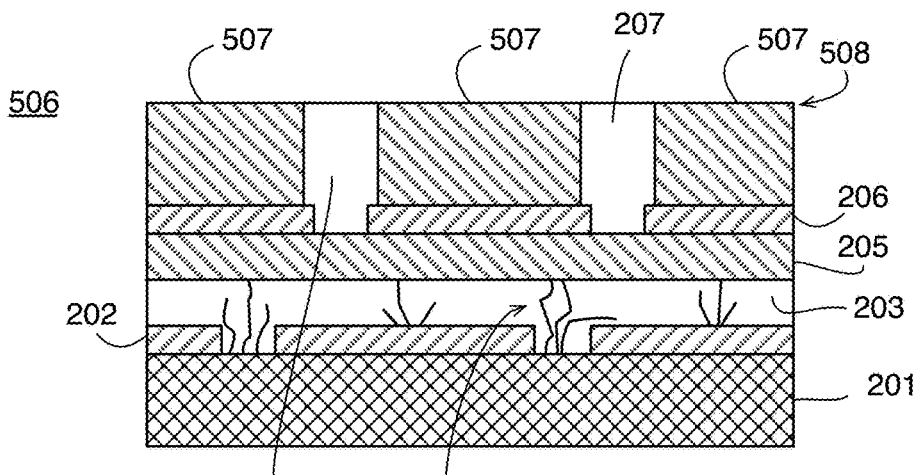

FIG. 5F illustrates a transistor structure 506 similar to transistor structure 504, after a backfill operation and optional planarization operation. As shown in FIG. 5F, backfill materials 507 may be provided between epitaxial III-N bumps 505 and an optional planarization may be performed to provide a substantially planar surface 508 and vertical extrinsic drain portions 207. Backfill materials 507 may include any material with etch selectivity with respect to vertical extrinsic drain portions 207 (e.g., an epitaxial III-N material) such that backfill materials 507 may be subsequently selectively removed. The planarization operation may include any suitable technique or technique such as a chemical-mechanical polishing operation and, as discussed, in some embodiments, a planarization operation may not be employed. Vertical extrinsic drain portions 207 may have any suitable thickness such as, for example, 40 nm-2 microns, as discussed.

Figure 5G:
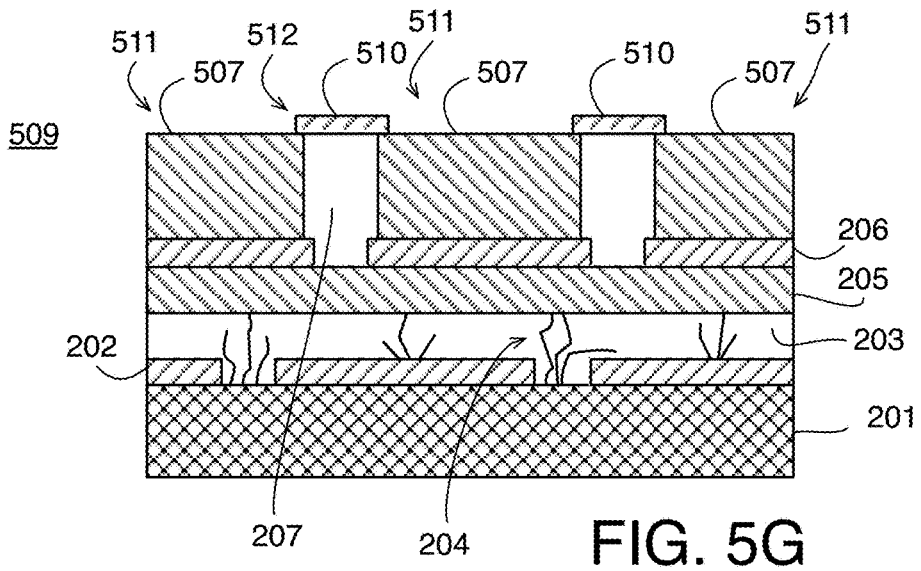

FIG. 5G illustrates a transistor structure 509 similar to transistor structure 506, after the formation of a hardmask 510. As shown in FIG. 5G, hardmask 510 may be formed and patterned such that hardmask 510 includes openings 511 substantially aligned with backfill materials 507. Hardmask 510 may include any material that is epitaxially selective with respect to epitaxial III-N material regions 103 such that a subsequent wider band gap material may be epitaxially grown from epitaxial III-N material regions 103 but not from hardmask 408. For example, any material discussed with respect to hardmasks herein (e.g., silicon oxide, silicon nitride, silicon oxynitride, aluminum oxide, or the like) may be used. As shown in FIG. 5G, one or more overhangs 512 may be permissible and possibly advantageous as they may limit the growth of subsequent epitaxial materials.

Figure 5H:
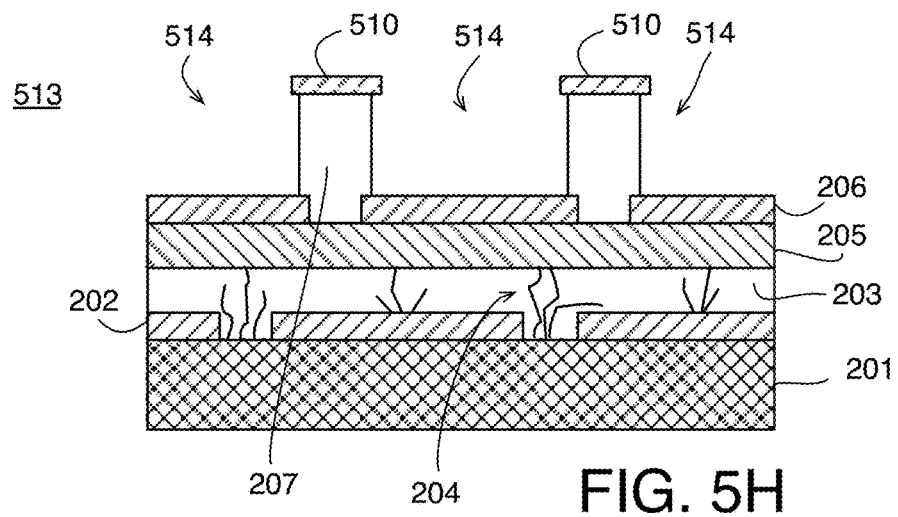

FIG. 5H illustrates a transistor structure 513 similar to transistor structure 509, after the removal of backfill materials 507 to expose openings 514. Backfill materials 507 may be removed using any suitable technique such as an etch operation or the like.

Figure 5I:
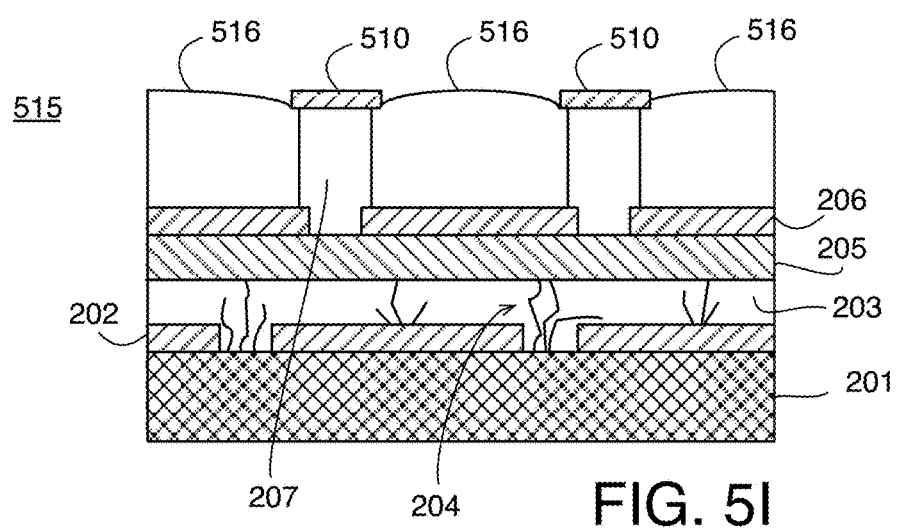

FIG. 5I illustrates a transistor structure 515 similar to transistor structure 513, after a lateral epitaxial growth of epitaxial III-N material bumps 516. Epitaxial III-N material bumps 516 may be formed via a lateral epitaxial growth via vertical extrinsic drain portions 207 (e.g., an epitaxial III-N material). Epitaxial III-N material bumps 516 may include any suitable material or materials such as, for example, GaN. Epitaxial III-N material bumps 516 may be formed using any suitable epitaxial growth technique such as, for example, an epitaxial growth via chemical vapor deposition, metal organic chemical vapor deposition, atomic layer deposition, or any other epitaxial growth technique. As shown, epitaxial III-N material bumps 516 may have a height approximately equal to or slightly larger than vertical extrinsic drain portions 207 such as, for example, 40 nm-2 microns. Also as shown, in some examples, epitaxial III-N material bumps 516 may include a rounded top surface such that a subsequent planarization operation may be advantageous. In other examples, epitaxial III-N material bumps 516 may have a substantially flat surface such that no planarization operation may be needed.

Figure 5J:
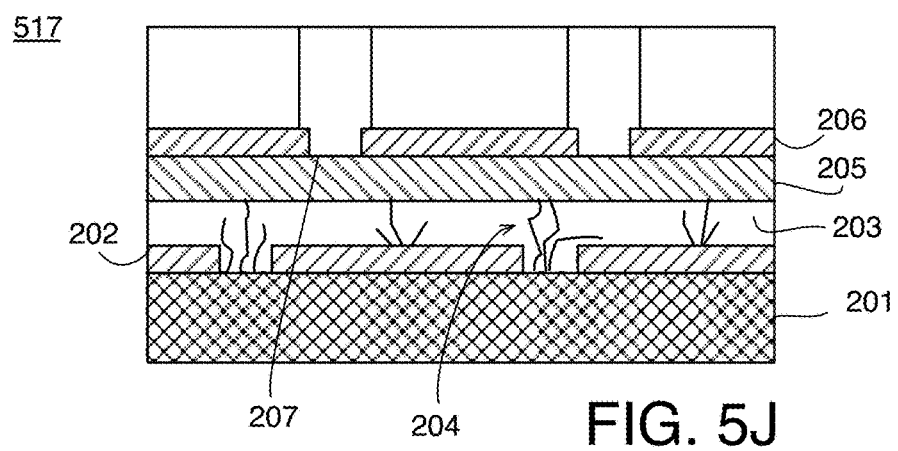

FIG. 5J illustrates a transistor structure 517 similar to transistor structure 515, after the removal of hardmask 510 and an optional planarization operation. Hardmask 510 may be removed using any suitable technique such as, for example, an etch or strip operation and the optional planarization operation, if needed, may include any suitable technique or techniques such as a chemical-mechanical planarization or the like.

Figure 5K:
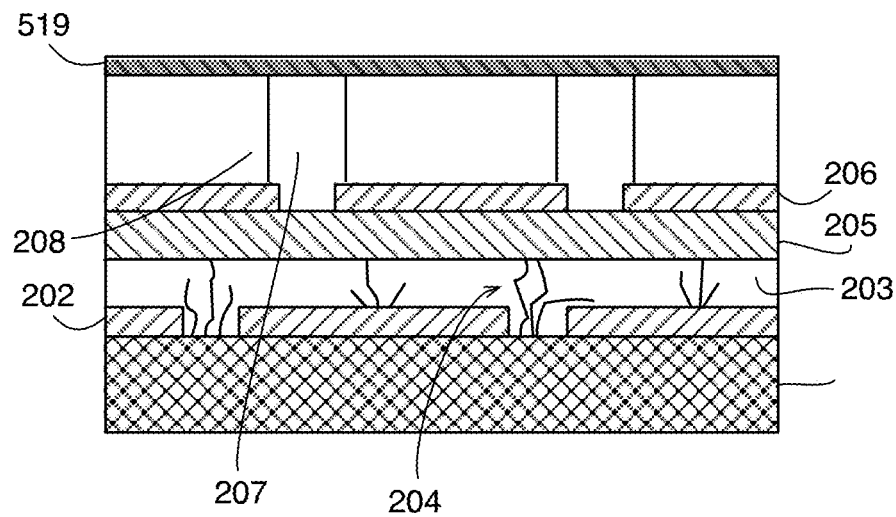

FIG. 5K illustrates a transistor structure 518 similar to transistor structure 518, after the epitaxial growth of polarization layer 519. Polarization layer 519 may include any material or material stacks that may provide a 2D electron gas in epitaxial III-N material regions 208 and/or vertical extrinsic drain portions 207. For example, as discussed, polarization layer 519 may be AlN, AlInN, or AlGaN, or any combination thereof. Polarization layer 519 may be formed using any suitable epitaxial growth technique such as, for example, an epitaxial growth via chemical vapor deposition, metal organic chemical vapor deposition, atomic layer deposition, or any other epitaxial growth technique.

Figure 5L:
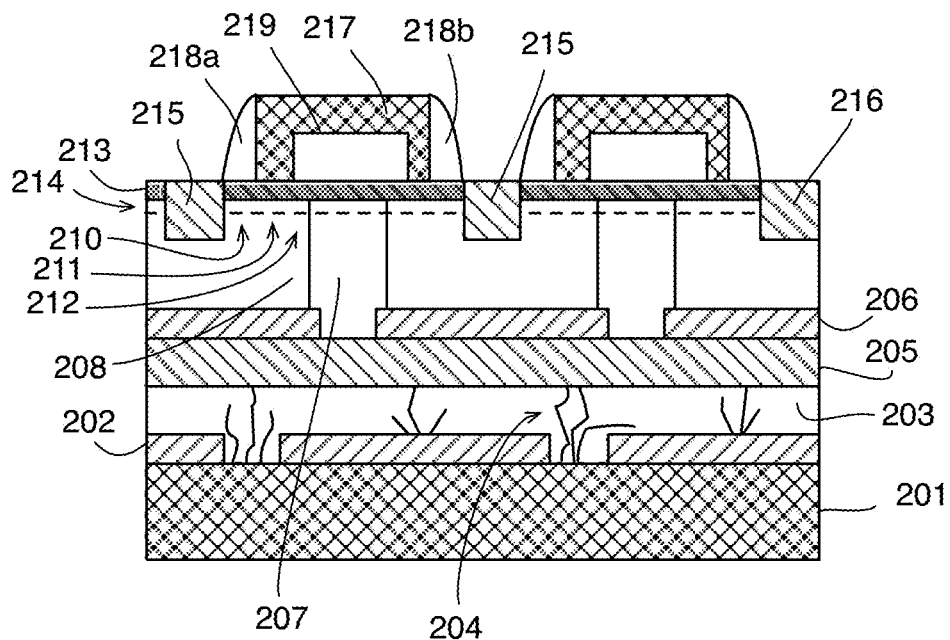

FIG. 5L illustrates a transistor structure 520 similar to transistor structure 518, after the formation of intrinsic source portions 215, exemplary gate 217 (including exemplary intra gate spacer 219), and exemplary sidewall spacers 218a, 218b. The formation of intrinsic source portions 215 may include, for example, a patterning operation, an etch operation, and an epitaxial re-growth operation generating intrinsic source portions 215. In an embodiment, intrinsic source portions 215 include an N+ material. In an embodiment, intrinsic source portions 215 include gallium indium nitride with less than about 10% indium doped with silicon. Gate 217 and sidewall spacers 218a, 218b may be formed using standard fabrication techniques. Gate 217 may include any suitable gate stack either including a dielectric, such as a non-epitaxial dielectric, proximal to channel 211 or a stack without a dielectric such as in a HEMT implementation. To achieve enhancement-mode operation as discussed, polarization layer may be removed from under gate 217 prior to a high-k dielectric deposition.

Figure 6:
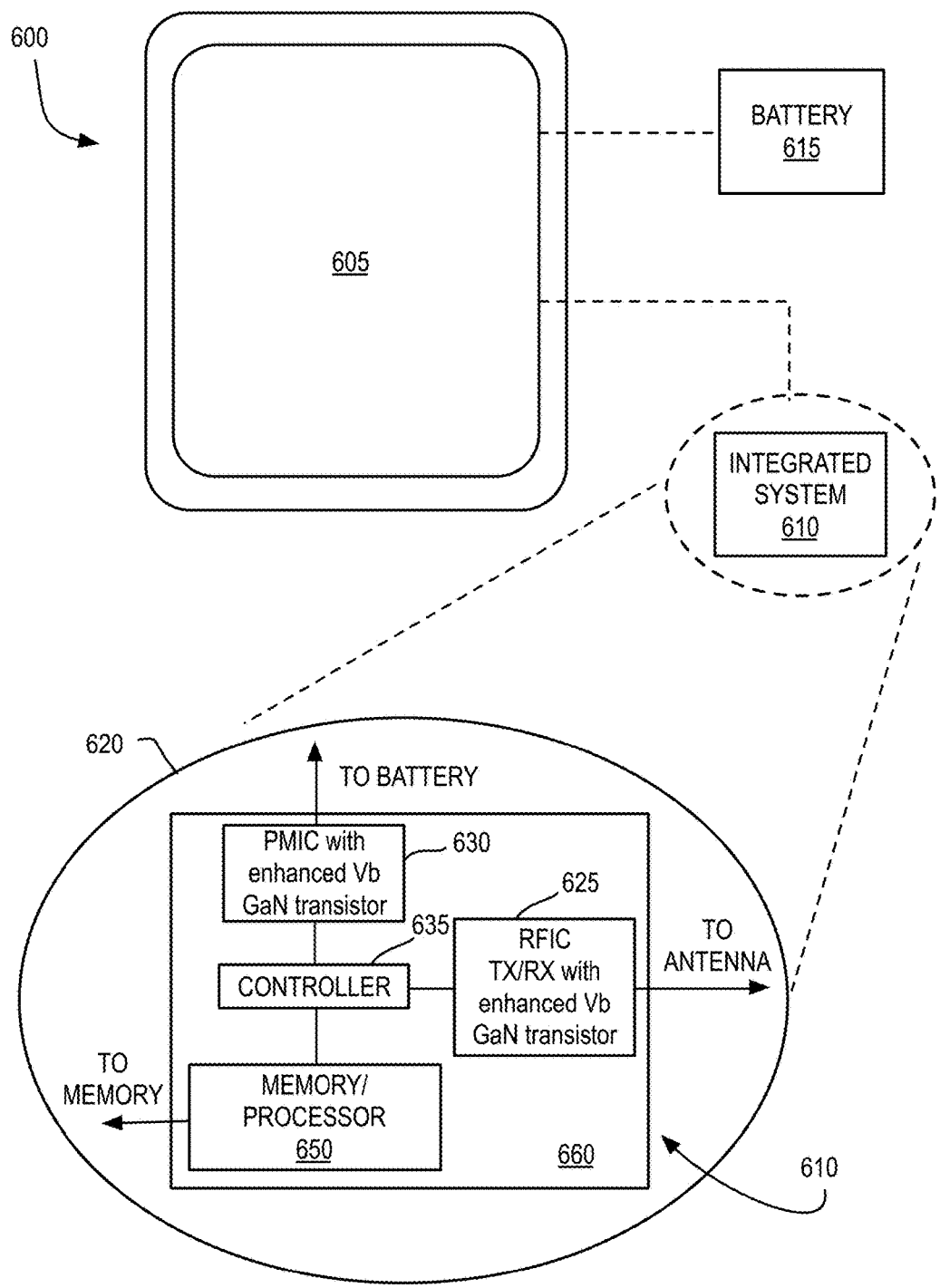
FIG. 6 is an illustrative diagram of a mobile computing platform employing an integrated circuit with transistor(s) having enhanced breakdown voltage.

FIG. 6 is an illustrative diagram of a mobile computing platform 600 employing an IC with transistor(s) having enhanced breakdown voltage ($V_b$), arranged in accordance with at least some implementations of the present disclosure. A transistor having increased or enhanced breakdown voltage may be any transistors as discussed herein such as transistor 100 or transistor 200 or the like. Mobile computing platform 600 may be any portable device configured for each of electronic data display, electronic data processing, wireless electronic data transmission, or the like. For example, mobile computing platform 600 may be any of a tablet, a smart phone, a netbook, a laptop computer, etc. and may include a display screen 605, which in the exemplary embodiment is a touchscreen (e.g., capacitive, inductive, resistive, etc. touchscreen), a chip-level (SoC) or package-level integrated system 610, and a battery 615.

Integrated system 610 is further illustrated in the expanded view 620. In the exemplary embodiment, packaged device 650 (labeled "Memory/Processor" in FIG. 6) includes at least one memory chip (e.g., RAM), and/or at least one processor chip (e.g., a microprocessor, a multi-core microprocessor, or graphics processor, or the like). In an embodiment, the package device 650 is a microprocessor including an SRAM cache memory. Packaged device 650 may be further coupled to (e.g., communicatively coupled to) a board, a substrate, or an interposer 660 along with, one or more of a power management integrated circuit (PMIC) 630, RF (wireless) integrated circuit (RFIC) 625 including a wideband RF (wireless) transmitter and/or receiver (TX/RX) (e.g., including a digital baseband and an analog front end module further comprises a power amplifier on a transmit path and a low noise amplifier on a receive path), and a controller thereof 635. In general, packaged device 650 may be also be coupled to (e.g., communicatively coupled to) display screen 605. As shown, one or both of PMIC 630 and RFIC 625 may employ a transistor having an enhanced breakdown voltage ($V_b$). For example, an employed transistor may include a hardmask disposed over a substrate such that the hardmask comprises at least one opening, a source, a drain, and a gate coupled channel between the source and the drain such that the channel comprises gallium nitride and is disposed over the hardmask and such that the drain comprises an extrinsic drain portion proximal to the channel and an intrinsic drain portion distal to the channel, and a polarization layer disposed over at least the extrinsic drain portion and the channel such that a portion of at least one of the source or the drain is disposed over the opening of the hardmask, or any other feature(s) as discussed herein.

Functionally, PMIC 630 may perform battery power regulation, DC-to-DC conversion, etc., and so has an input coupled to battery 615 and with an output providing a current supply to other functional modules. In an embodiment, PMIC 630 may perform high voltage operations. As further illustrated, in the exemplary embodiment, RFIC 625 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs coupled to the package substrate of packaged device 650 or within a single IC (SoC) coupled to the package substrate of the packaged device 650.

Figure 7:
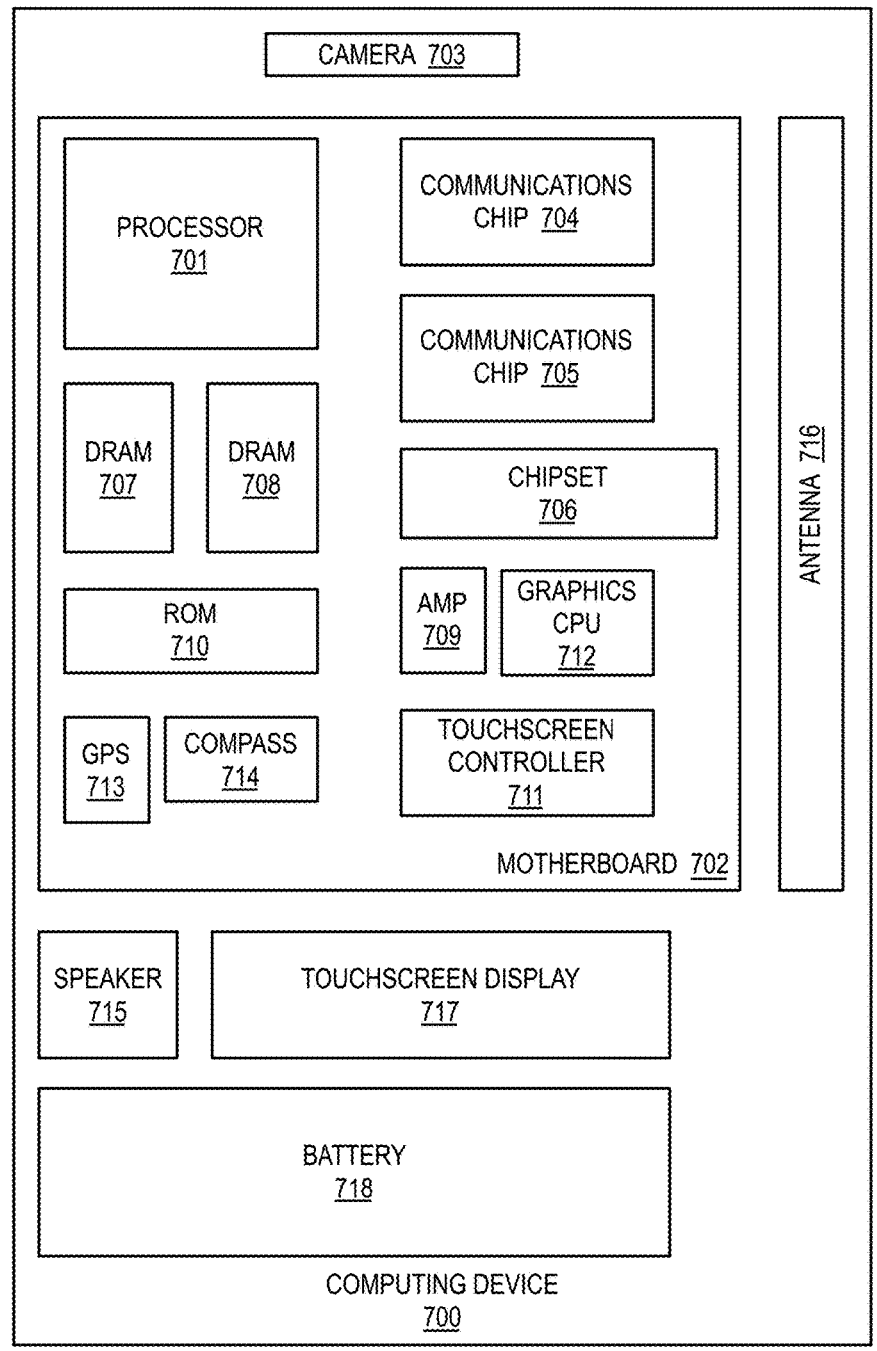
FIG. 7 is a functional block diagram of a computing device, all arranged in accordance with at least some implementations of the present disclosure.

FIG. 7 is a functional block diagram of a computing device 700, arranged in accordance with at least some implementations of the present disclosure. Computing device 700 may be found inside platform 600, for example, and further includes a motherboard 702 hosting a number of components, such as but not limited to a processor 701 (e.g., an applications processor) and one or more communications chips 704, 705. Processor 701 may be physically and/or electrically coupled to motherboard 702. In some examples, processor 701 includes an integrated circuit die packaged within the processor 701. In general, the term "processor" may refer to any device or portion of a device that processes electronic data from registers and/or memory to transform that electronic data into other electronic data that may be stored in registers and/or memory.

In various examples, one or more communication chips 704, 705 may also be physically and/or electrically coupled to the motherboard 702. In further implementations, communication chips 704 may be part of processor 701. Depending on its applications, computing device 700 may include other components that may or may not be physically and electrically coupled to motherboard 702. These other components may include, but are not limited to, volatile memory (e.g., DRAM) 707, 708, non-volatile memory (e.g., ROM) 710, a graphics processor 712, flash memory, global positioning system (GPS) device 713, compass 714, a chipset 706, an antenna 716, a power amplifier 709, a touchscreen controller 711, a touchscreen display 717, a speaker 715, a camera 703, and a battery 718, as illustrated, and other components such as a digital signal processor, a crypto processor, an audio codec, a video codec, an accelerometer, a gyroscope, and a mass storage device (such as hard disk drive, solid state drive (SSD), compact disk (CD), digital versatile disk (DVD), and so forth), or the like.

Communication chips 704, 705 may enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 704, 705 may implement any of a number of wireless standards or protocols, including but not limited to those described elsewhere herein. As discussed, computing device 700 may include a plurality of communication chips 704, 705. For example, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

As used in any implementation described herein, the term "module" refers to any combination of software, firmware and/or hardware configured to provide the functionality described herein. The software may be embodied as a software package, code and/or instruction set or instructions, and "hardware", as used in any implementation described herein, may include, for example, singly or in any combination, hardwired circuitry, programmable circuitry, state machine circuitry, and/or firmware that stores instructions executed by programmable circuitry. The modules may, collectively or individually, be embodied as circuitry that forms part of a larger system, for example, an integrated circuit (IC), system on-chip (SoC), and so forth.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

The following examples pertain to further embodiments.

In one or more first embodiments, a transistor includes a hardmask disposed over a substrate such that the hardmask comprises at least one opening, a source, a drain, and a gate coupled channel between the source and the drain such that the channel comprises gallium nitride and is be disposed over the hardmask and such that the drain comprises an extrinsic drain portion proximal to the channel and an intrinsic drain portion distal to the channel, and a polarization layer disposed over at least the extrinsic drain portion such that a portion of at least one of the source or the drain may be disposed over the opening of the hardmask.

Further to the first embodiments, the extrinsic drain portion comprises a material having a wider band gap than the channel.

Further to the first embodiments, the gate comprises a gate stack including a non-epitaxial dielectric proximal to the channel.

Further to the first embodiments, the gate comprises a gate stack including a non-epitaxial dielectric proximal to the channel and the source comprises an extrinsic source portion proximal to the channel and an intrinsic source portion distal to the channel such that the polarization layer is disposed over the extrinsic source portion and has an opening over the channel.

Further to the first embodiments, the portion of the source is disposed over the opening of the hardmask and the extrinsic drain portion comprises a material having a wider band gap than the channel.

Further to the first embodiments, the portion of the source is disposed over the opening of the hardmask and the extrinsic drain portion comprises a material having a wider band gap than the channel such that the material comprises aluminum gallium nitride.

Further to the first embodiments, the portion of the source is disposed over the opening of the hardmask and the extrinsic drain portion comprises a material having a wider band gap than the channel such that the material comprises aluminum gallium nitride, and the extrinsic drain portion comprises a graded extrinsic drain portion having an increasing aluminum percentage from a junction between the channel and the extrinsic drain portion toward the intrinsic drain portion.

Further to the first embodiments, the portion of the source is disposed over the opening of the hardmask and the extrinsic drain portion comprises a material having a wider band gap than the channel such that the material comprises aluminum gallium nitride, and the aluminum gallium nitride comprises a percentage of aluminum of no more than 10% with a balance of gallium.

Further to the first embodiments, the portion of the source is disposed over the opening of the hardmask and the extrinsic drain portion comprises a material having a wider band gap than the channel such that the material comprises aluminum gallium nitride, and a predetermined breakdown voltage of the transistor is at least 10 volts and a lateral length of the extrinsic drain portion is less than 45 nm.

Further to the first embodiments, the intrinsic drain portion is disposed under the hardmask and extends laterally under the hardmask.

Further to the first embodiments, the intrinsic drain portion is disposed under the hardmask and extends laterally under the hardmask and the extrinsic drain portion comprises a vertical extrinsic drain portion disposed over the opening of the hardmask and extending between the channel and the intrinsic drain.

Further to the first embodiments, the intrinsic drain portion is disposed under the hardmask and extends laterally under the hardmask and the extrinsic drain portion comprises a vertical extrinsic drain portion disposed over the opening of the hardmask and extending between the channel and the intrinsic drain, and the transistor further comprises a second hardmask comprising at least one second opening disposed between the hardmask and the substrate and a III-N material layer disposed over the second hardmask, wherein the intrinsic drain portion is disposed over the III-N material layer.

Further to the first embodiments, the intrinsic drain portion is disposed under the hardmask and extends laterally under the hardmask and the extrinsic drain portion comprises a vertical extrinsic drain portion disposed over the opening of the hardmask and extending between the channel and the intrinsic drain, and the transistor further comprises a second hardmask comprising at least one second opening disposed between the hardmask and the substrate and a III-N material layer disposed over the second hardmask, wherein the intrinsic drain portion is disposed over the III-N material layer, and the second opening is laterally offset from the vertical extrinsic drain portion by one fourth of a pitch between the vertical extrinsic drain portion and a second vertical extrinsic drain portion.

Further to the first embodiments, the intrinsic drain portion is disposed under the hardmask and extends laterally under the hardmask and the extrinsic drain portion comprises a vertical extrinsic drain portion disposed over the opening of the hardmask and extending between the channel and the intrinsic drain, and the transistor further comprises a second hardmask comprising at least one second opening disposed between the hardmask and the substrate and a III-N material layer disposed over the second hardmask, wherein the intrinsic drain portion is disposed over the III-N material layer, and a predetermined breakdown voltage of the transistor is at least 100 volts and an effective length of the extrinsic drain portion is less than 440 nm.

In one or more second embodiments, a method of fabricating a transistor includes forming a hardmask over a substrate such that the hardmask comprises at least one opening, forming a source, a drain, and a channel between the source and the drain such that the channel comprises gallium nitride and is formed over the hardmask, such that forming the drain comprises forming an extrinsic drain portion proximal to the channel and forming an intrinsic drain portion distal to the channel, and such that a portion of at least one of the source or the drain is disposed over the opening of the hardmask, disposing a polarization layer over at least the extrinsic drain portion and the channel, and forming a gate over the channel.

Further to the second embodiments, the extrinsic drain portion comprises a material having a wider band gap than the channel.

Further to the second embodiments, forming the extrinsic drain portion comprises laterally epitaxially growing a material having a wider band gap than the channel.

Further to the second embodiments, the method further comprises removing a portion of the polarization layer from over the channel such that forming the gate comprises forming the gate directly on the channel.

Further to the second embodiments, disposing the polarization layer comprises disposing the polarization layer between the channel and the gate.

Further to the second embodiments, forming the extrinsic drain portion comprises laterally epitaxially growing a graded aluminum gallium nitride having an increasing aluminum percentage from a junction between the channel and the extrinsic drain portion toward the intrinsic drain portion.

Further to the second embodiments, the intrinsic drain portion is disposed under the hardmask and extends laterally under the hardmask.

Further to the second embodiments, the intrinsic drain portion is disposed under the hardmask and extends laterally under the hardmask and the method further comprises forming a second hardmask comprising at least one second opening between the hardmask and the substrate and epitaxially overgrowing a III-N material layer over the second hardmask, wherein the intrinsic drain portion is formed over the III-N material layer.

In one or more third embodiments, a system comprises a power management integrated circuit further comprising a transistor including a hardmask over a substrate, wherein the hardmask comprises at least one opening, a source, a drain, and a gate coupled channel between the source and the drain such that the channel comprises gallium nitride and is disposed over the hardmask and such that the drain comprises an extrinsic drain portion proximal to the channel and an intrinsic drain portion distal to the channel, and a polarization layer disposed over at least the extrinsic drain portion such that a portion of at least one of the source or the drain is disposed over the opening of the hardmask.

Further to the third embodiments, the portion of the source is disposed over the opening of the hardmask and the extrinsic drain portion comprises aluminum gallium nitride having a percentage of aluminum of no more than 10% with a balance of gallium.

Further to the third embodiments, the intrinsic drain portion is disposed under the hardmask and extends laterally under the hardmask and wherein the extrinsic drain portion comprises a vertical extrinsic drain portion disposed over the opening of the hardmask and extending between the channel and the intrinsic drain.

Further to the third embodiments, the intrinsic drain portion is disposed under the hardmask and extends laterally under the hardmask and wherein the extrinsic drain portion comprises a vertical extrinsic drain portion disposed over the opening of the hardmask and extending between the channel and the intrinsic drain, and the transistor further comprises a second hardmask comprising at least one second opening disposed between the hardmask and the substrate and a III-N material layer disposed over the second hardmask, wherein the intrinsic drain portion is disposed over the III-N material layer.

Further to the third embodiments, the source comprises an extrinsic source portion proximal to the channel and an intrinsic source portion distal to the channel and the polarization layer is disposed over the extrinsic source portion and has an opening over the channel.

Further to the third embodiments, the extrinsic drain portion comprises a material having a wider band gap than the channel.

Further to the third embodiments, the extrinsic drain portion comprises a material having a wider band gap than the channel and the extrinsic drain portion comprises a graded extrinsic drain portion having an increasing aluminum percentage from a junction between the channel and the extrinsic drain portion toward the intrinsic drain portion.

Further to the third embodiments, the gate comprises a gate stack including a non-epitaxial dielectric proximal to the channel.

Further to the third embodiments, the transistor includes any characteristic as described with respect to the first embodiments.

In one or more fourth embodiments, a mobile computing platform comprises any of the example structures discussed with respect to the first or third embodiments.

It will be recognized that the invention is not limited to the embodiments so described, but can be practiced with modification and alteration without departing from the scope of the appended claims. For example, the above embodiments may include specific combination of features. However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. A transistor comprising:
    a hardmask disposed over a substrate, wherein the hardmask comprises at least one opening;
    a source, a drain, and a gate coupled channel between the source and the drain, wherein the channel comprises gallium nitride and is disposed over the hardmask, and wherein the drain comprises an extrinsic drain portion proximal to the channel and an intrinsic drain portion distal to the channel; and
    a polarization layer disposed over at least the extrinsic drain portion, wherein a portion of at least one of the source or the drain is disposed over the opening of the hardmask.

2. The transistor of claim 1, wherein the extrinsic drain portion comprises a material having a wider band gap than the channel.

3. The transistor of claim 1, wherein the gate comprises a gate stack including a non-epitaxial dielectric proximal to the channel.

4. The transistor of claim 3, wherein the source comprises an extrinsic source portion proximal to the channel and an intrinsic source portion distal to the channel, wherein the polarization layer is disposed over the extrinsic source portion and has an opening over the channel.

5. The transistor of claim 1, wherein the portion of the source is disposed over the opening of the hardmask, and wherein the extrinsic drain portion comprises a material having a wider band gap than the channel.

6. The transistor of claim 5, wherein the material comprises aluminum gallium nitride.

7. The transistor of claim 6, wherein the extrinsic drain portion comprises a graded extrinsic drain portion having an increasing aluminum percentage from a junction between the channel and the extrinsic drain portion toward the intrinsic drain portion.

8. The transistor of claim 6, wherein the aluminum gallium nitride comprises a percentage of aluminum of no more than 10% with a balance of gallium.

9. The transistor of claim 6, wherein a predetermined breakdown voltage of the transistor is at least 10 volts and a lateral length of the extrinsic drain portion is less than 45 nm.

10. The transistor of claim 1, wherein the intrinsic drain portion is disposed under the hardmask and extends laterally under the hardmask.

11. The transistor of claim 10, wherein the extrinsic drain portion comprises a vertical extrinsic drain portion disposed over the opening of the hardmask and extending between the channel and the intrinsic drain.

12. The transistor of claim 11, further comprising:
    a second hardmask comprising at least one second opening disposed between the hardmask and the substrate; and
    a III-N material layer disposed over the second hardmask, wherein the intrinsic drain portion is disposed over the III-N material layer.

13. The transistor of claim 12, wherein the second opening is laterally offset from the vertical extrinsic drain portion by one fourth of a pitch between the vertical extrinsic drain portion and a second vertical extrinsic drain portion.

14. The transistor of claim 11, wherein a predetermined breakdown voltage of the transistor is at least 100 volts and an effective length of the extrinsic drain portion is less than 440 nm.

15. A method for fabricating a transistor comprising:
    forming a hardmask over a substrate, wherein the hardmask comprises at least one opening;
    forming a source, a drain, and a channel between the source and the drain, wherein the channel comprises gallium nitride and is formed over the hardmask, wherein forming the drain comprises forming an extrinsic drain portion proximal to the channel and forming an intrinsic drain portion distal to the channel, and wherein a portion of at least one of the source or the drain is disposed over the opening of the hardmask;
    disposing a polarization layer over at least the extrinsic drain portion; and
    forming a gate over the channel.

16. The method of claim 15, wherein the extrinsic drain portion comprises a material having a wider band gap than the channel.

17. The method of claim 15, wherein forming the extrinsic drain portion comprises laterally epitaxially growing a material having a wider band gap than the channel.

18. The method of claim 15, wherein forming the extrinsic drain portion comprises laterally epitaxially growing a graded aluminum gallium nitride having an increasing aluminum percentage from a junction between the channel and the extrinsic drain portion toward the intrinsic drain portion.

19. The method of claim 15, wherein the intrinsic drain portion is disposed under the hardmask and extends laterally under the hardmask.

20. The method of claim 19, further comprising:
    forming a second hardmask comprising at least one second opening between the hardmask and the substrate; and
    epitaxially overgrowing a III-N material layer over the second hardmask, wherein the intrinsic drain portion is formed over the III-N material layer.

21. A system comprising:
    a power management integrated circuit further comprising a transistor including:
        a hardmask over a substrate, wherein the hardmask comprises at least one opening;
        a source, a drain, and a gate coupled channel between the source and the drain, wherein the channel comprises gallium nitride and is disposed over the hardmask, and wherein the drain comprises an extrinsic drain portion proximal to the channel and an intrinsic drain portion distal to the channel; and
        a polarization layer disposed over at least the extrinsic drain portion, wherein a portion of at least one of the source or the drain is disposed over the opening of the hardmask.

22. The system of claim 21, wherein the portion of the source is disposed over the opening of the hardmask, and wherein the extrinsic drain portion comprises aluminum gallium nitride having a percentage of aluminum of no more than 10% with a balance of gallium.

23. The system of claim 21, wherein the intrinsic drain portion is disposed under the hardmask and extends laterally under the hardmask, and wherein the extrinsic drain portion comprises a vertical extrinsic drain portion disposed over the opening of the hardmask and extending between the channel and the intrinsic drain.

24. The system of claim 23, the transistor further comprising:
- a second hardmask comprising at least one second opening disposed between the hardmask and the substrate; and
- a III-N material layer disposed over the second hardmask, wherein the intrinsic drain portion is disposed over the III-N material layer.

* * * * *